United States Patent
Herrmann

(10) Patent No.: US 10,270,019 B2
(45) Date of Patent: Apr. 23, 2019

(54) OPTOELECTRONIC SEMICONDUCTOR CHIP, OPTOELECTRONIC SEMICONDUCTOR COMPONENT AND METHOD FOR PRODUCING AN OPTOELECTRONIC SEMICONDUCTOR CHIP

(71) Applicant: OSRAM Opto Semiconductors GmbH, Regensburg (DE)

(72) Inventor: Siegfried Herrmann, Neukirchen (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 0 days.

(21) Appl. No.: 15/561,161

(22) PCT Filed: Mar. 29, 2016

(86) PCT No.: PCT/EP2016/056819
§ 371 (c)(1),
(2) Date: Sep. 25, 2017

(87) PCT Pub. No.: WO2016/156329
PCT Pub. Date: Oct. 6, 2016

(65) Prior Publication Data
US 2018/0102466 A1    Apr. 12, 2018

(30) Foreign Application Priority Data
Mar. 30, 2015   (DE) .................. 10 2015 104 886

(51) Int. Cl.
| | | |
|---|---|---|
| H01L 33/62 | (2010.01) | |
| H01L 33/38 | (2010.01) | |
| H01L 25/075 | (2006.01) | |
| H01L 33/00 | (2010.01) | |
| H01L 33/20 | (2010.01) | |
| H01L 33/46 | (2010.01) | |
| H01L 33/50 | (2010.01) | |
| H01L 21/56 | (2006.01) | |
| H01L 33/06 | (2010.01) | |
| H01L 33/30 | (2010.01) | |

(52) U.S. Cl.
CPC .......... *H01L 33/62* (2013.01); *H01L 25/0753* (2013.01); *H01L 33/0066* (2013.01);
(Continued)

(58) Field of Classification Search
None
See application file for complete search history.

(56) References Cited

U.S. PATENT DOCUMENTS

| | | |
|---|---|---|
| 9,905,741 B2 | 2/2018 | Oyu |
| 2011/0140284 A1 | 6/2011 | Gunther et al. |

(Continued)

FOREIGN PATENT DOCUMENTS

| | | |
|---|---|---|
| CN | 104022216 A | 9/2014 |
| DE | 102009032606 A1 | 1/2011 |

(Continued)

OTHER PUBLICATIONS

Justel, T. "Inkoharente Lichtquellen," downloaded from https://www.fh-muenster.de/fb1/downloads/personal/juestel/juestel/9-InkohaerentelLichtquellen-Anorganische_LEDs.pdt in 2017, 44 pages (English Abstract only).

*Primary Examiner* — Alexander G Ghyka
(74) *Attorney, Agent, or Firm* — Slater Matsil, LLP

(57) ABSTRACT

An optoelectronic semiconductor chip, an optoelectronic semiconductor component and a method for producing an optoelectronic semiconductor chip are disclosed. In an embodiment the chip includes a main body including a carrier having a top, a bottom opposite the top and side faces connecting the bottom with the top and a semiconductor layer sequence arranged on the top of the carrier, wherein the semiconductor layer sequence is configured to emit or absorb electromagnetic radiation and two contact faces arranged on the semiconductor layer sequence. The chip further includes two contact elements contacting the contact faces, wherein the contact elements include conductor tracks which are guided from the contact faces over edges of the main body on the side faces of the carrier.

20 Claims, 22 Drawing Sheets

(52) U.S. Cl.
CPC .......... *H01L 33/0079* (2013.01); *H01L 33/20* (2013.01); *H01L 33/38* (2013.01); *H01L 33/46* (2013.01); *H01L 33/505* (2013.01); *H01L 21/568* (2013.01); *H01L 33/06* (2013.01); *H01L 33/30* (2013.01); *H01L 2224/24* (2013.01); *H01L 2224/48091* (2013.01); *H01L 2224/73267* (2013.01); *H01L 2224/82* (2013.01); *H01L 2224/92244* (2013.01); *H01L 2933/0016* (2013.01); *H01L 2933/0066* (2013.01)

(56) References Cited

U.S. PATENT DOCUMENTS

| | | |
|---|---|---|
| 2012/0228666 A1 | 9/2012 | Weidner et al. |
| 2012/0301982 A1* | 11/2012 | Baur .................. H01L 24/24 438/28 |
| 2014/0239318 A1 | 8/2014 | Oyu |
| 2015/0129901 A1 | 5/2015 | Hoppel et al. |
| 2016/0056344 A1 | 2/2016 | Reill et al. |
| 2016/0087177 A1 | 3/2016 | Schwarz et al. |
| 2016/0172547 A1 | 6/2016 | von Malm |

FOREIGN PATENT DOCUMENTS

| | | |
|---|---|---|
| DE | 102009036622 A1 | 2/2011 |
| DE | 102012106364 A1 | 1/2014 |
| DE | 102013103226 A1 | 10/2014 |
| DE | 102013104840 A1 | 11/2014 |
| DE | 102013107862 A1 | 1/2015 |
| JP | 2007287849 A | 11/2007 |
| JP | 2010258230 A | 11/2010 |
| JP | 2014195064 A | 10/2014 |
| JP | 2015153793 A | 8/2015 |
| WO | 2011032853 A1 | 3/2011 |
| WO | 2016180732 A1 | 11/2016 |
| WO | 2016180734 A1 | 11/2016 |

* cited by examiner

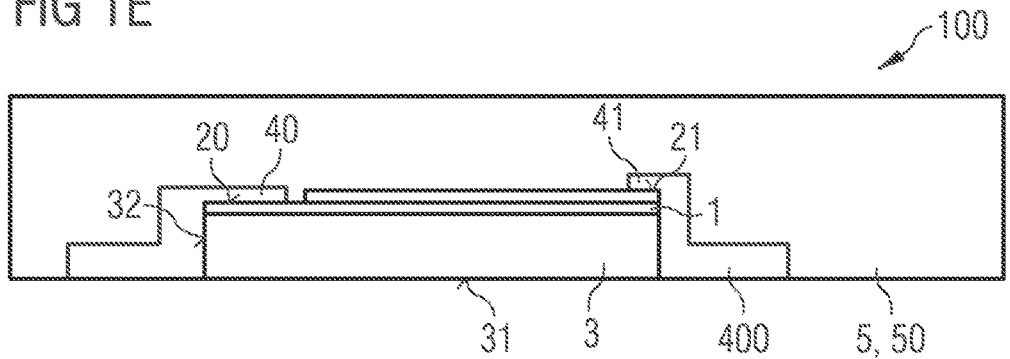
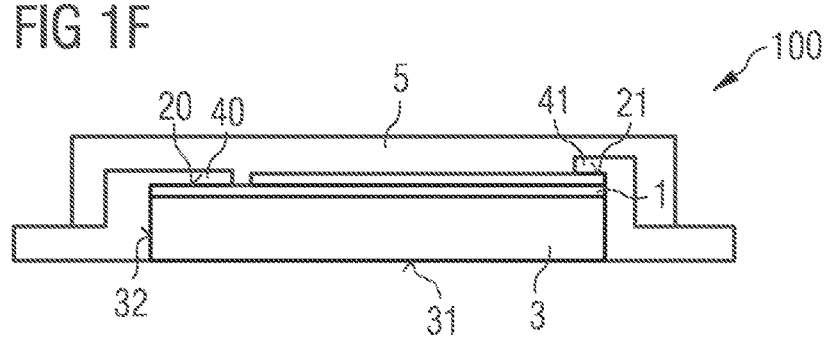
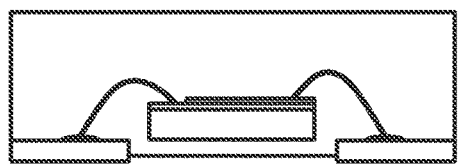
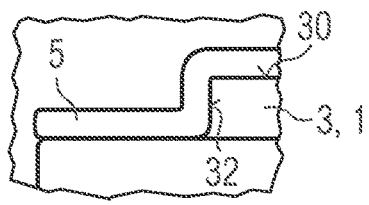

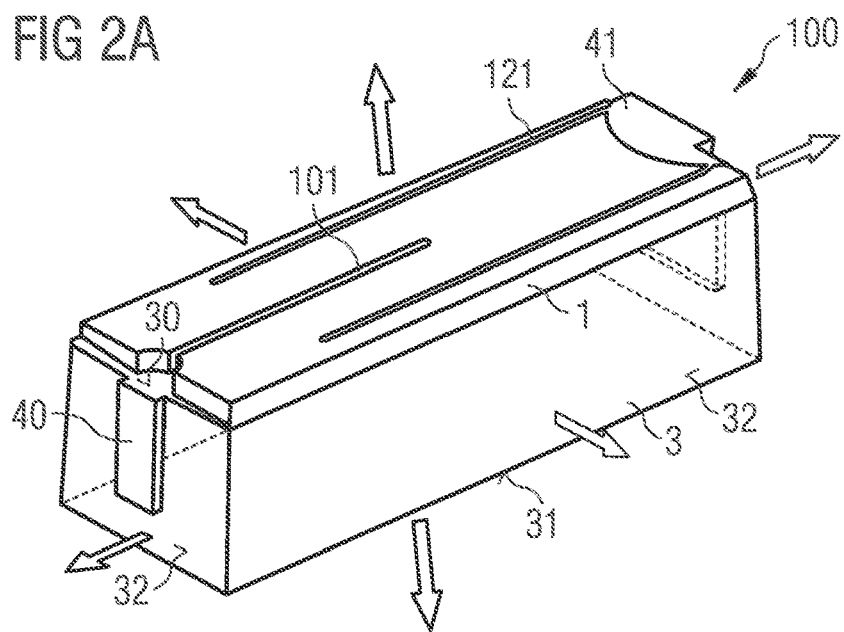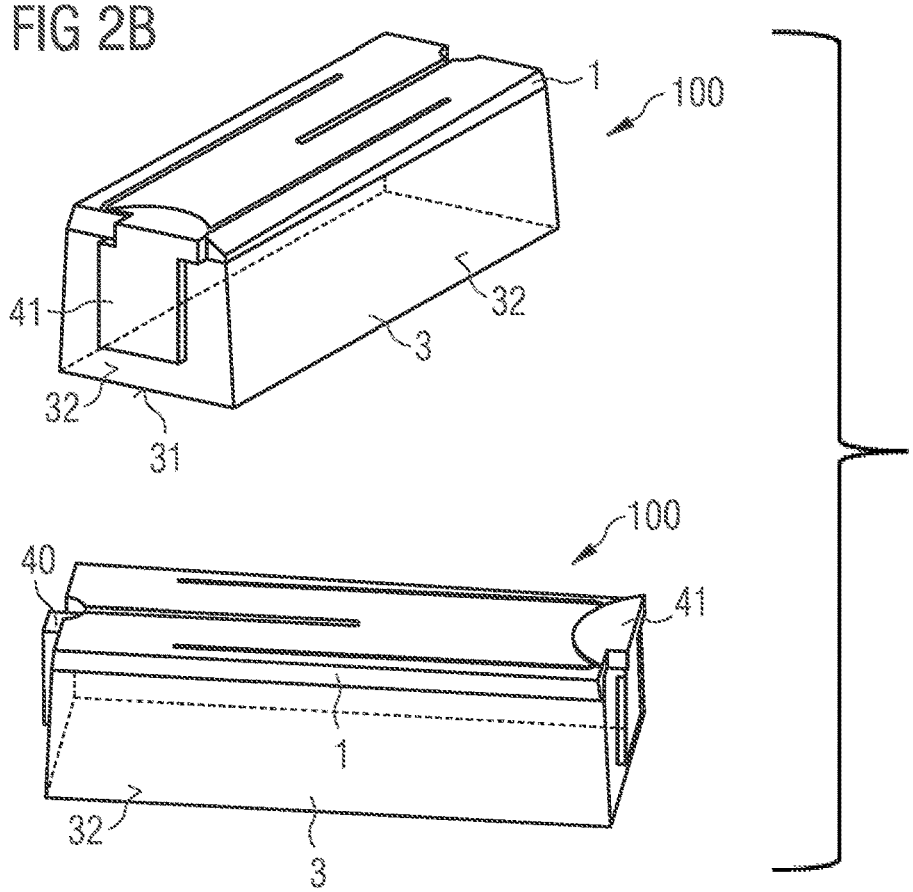

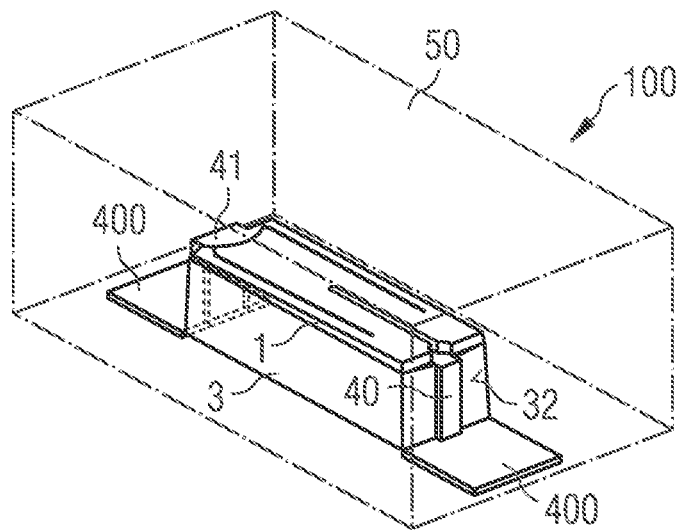
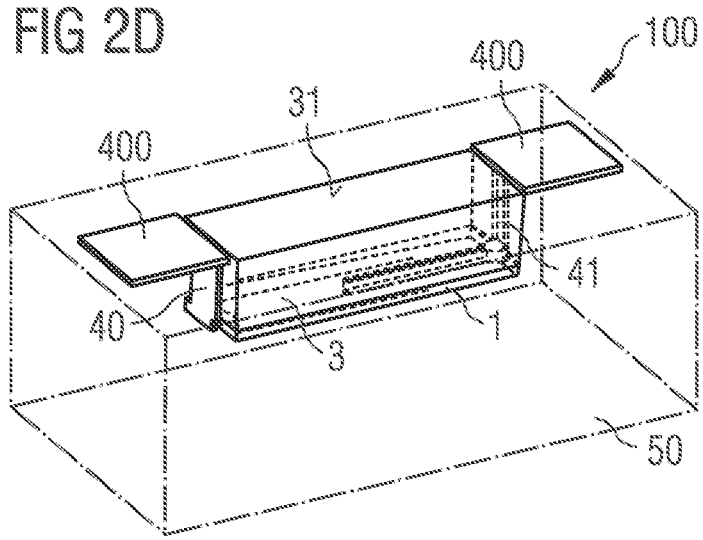

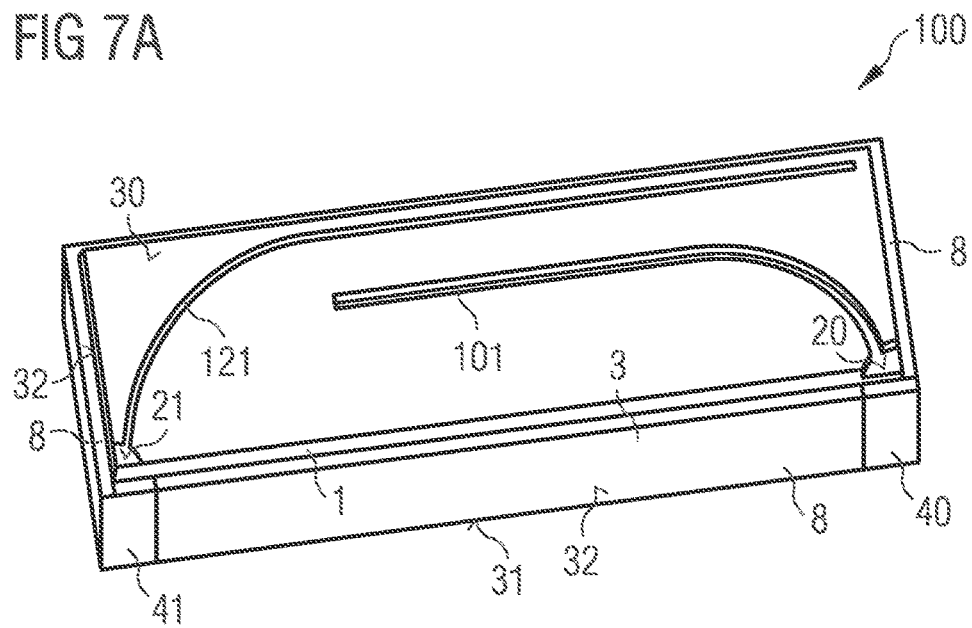
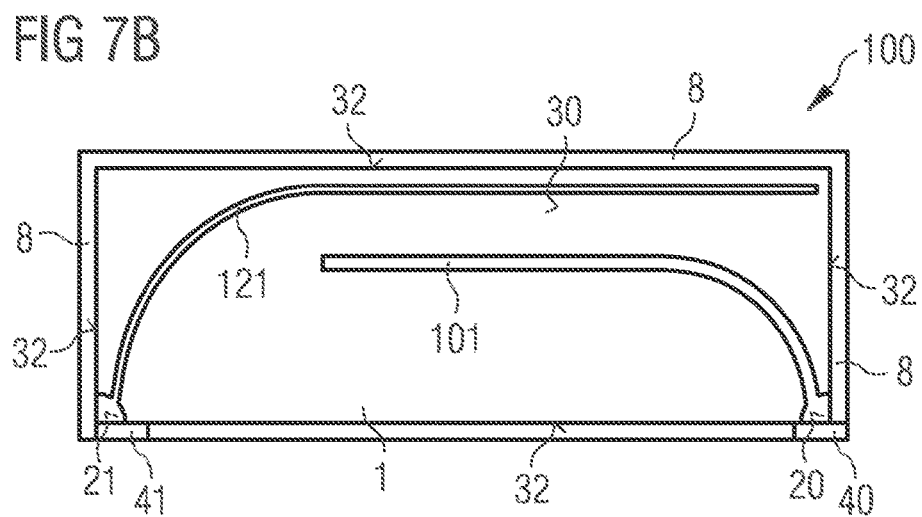

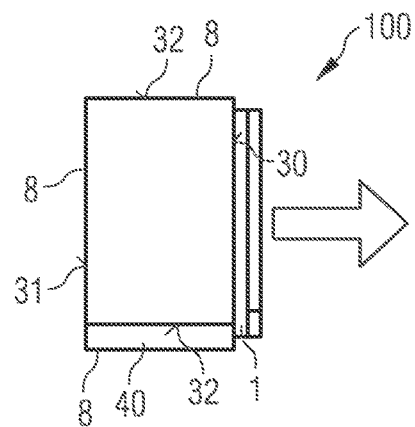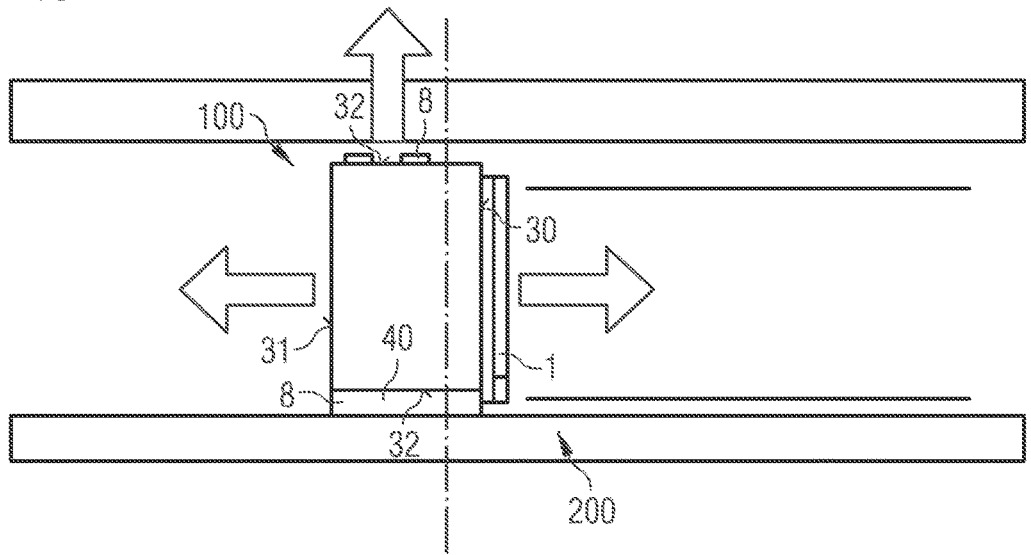

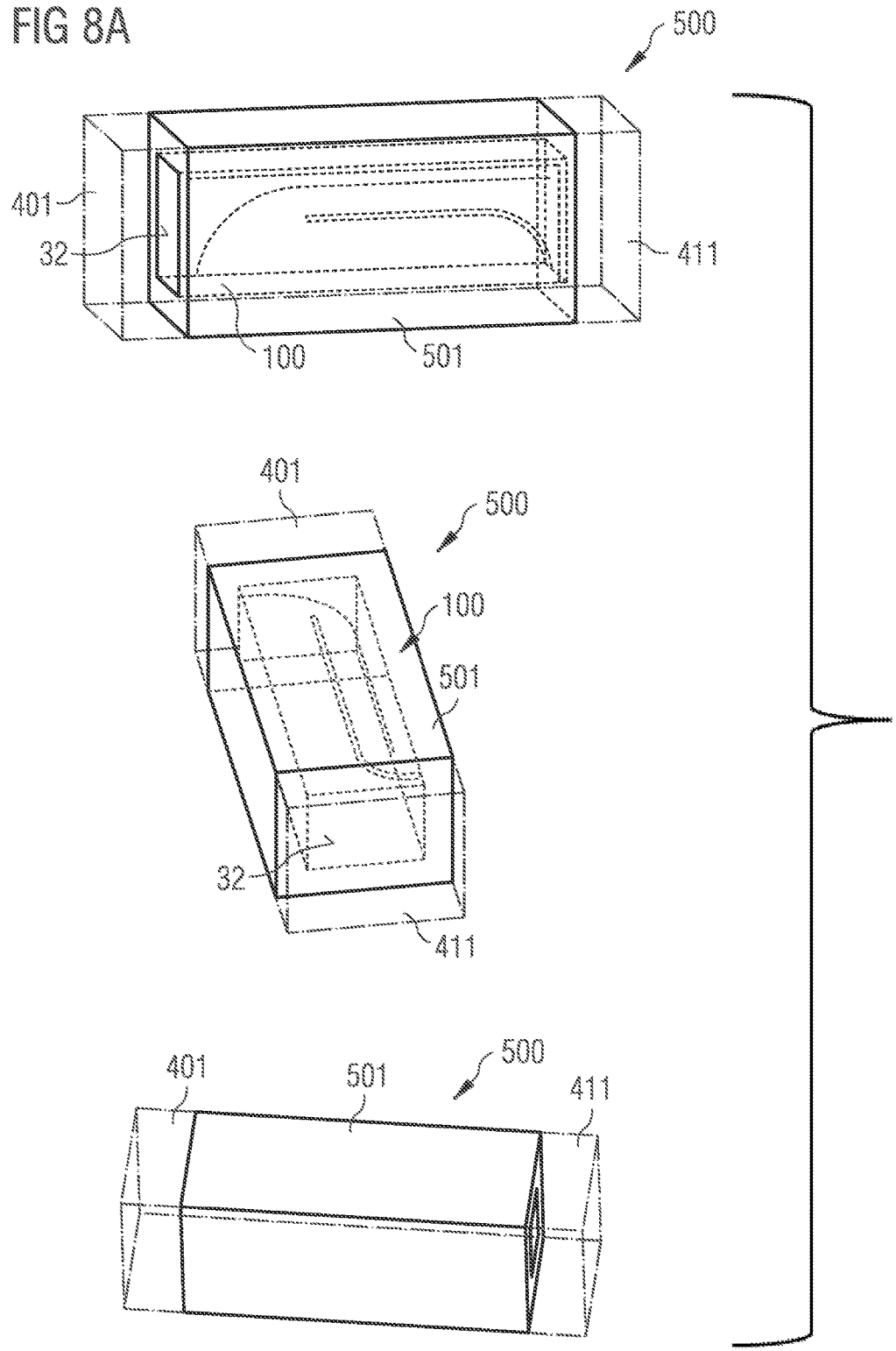

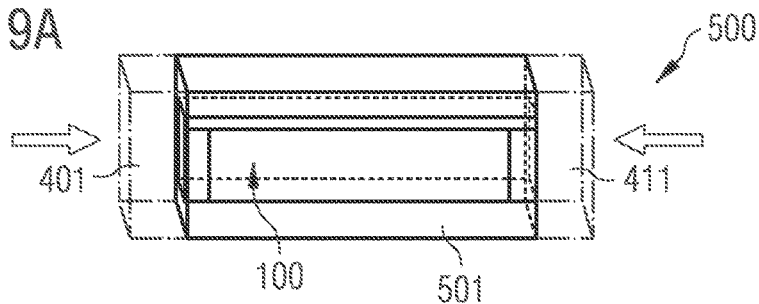
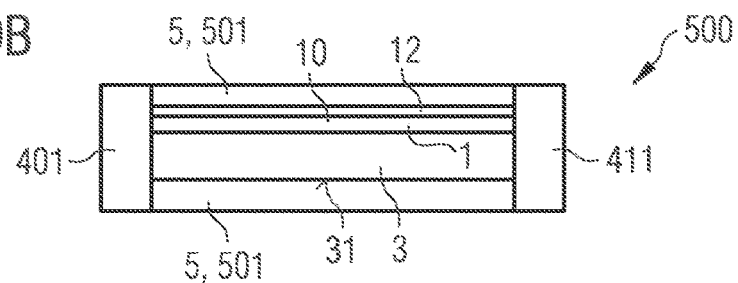
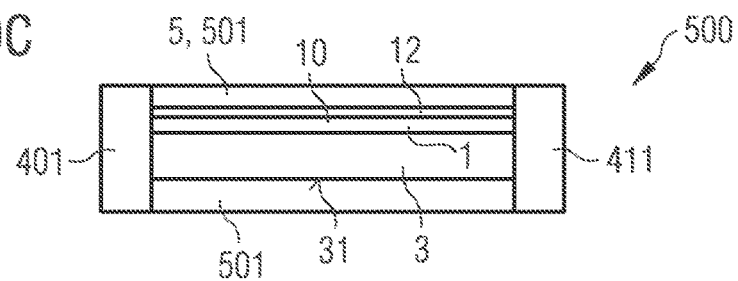
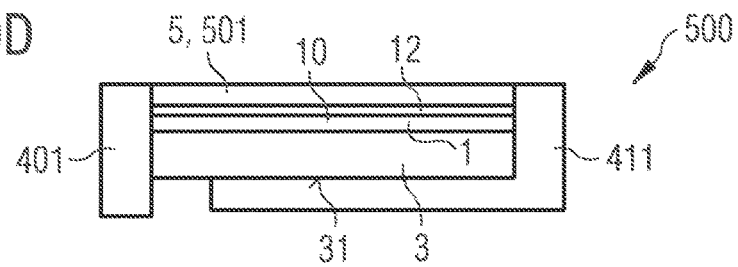
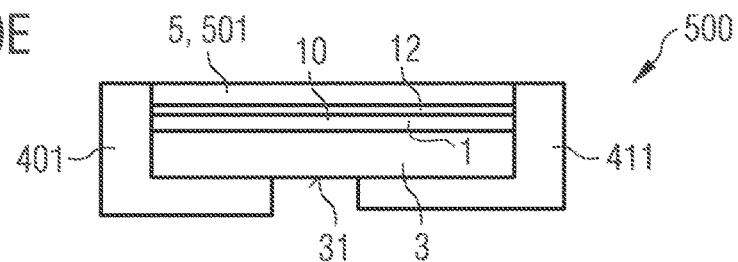

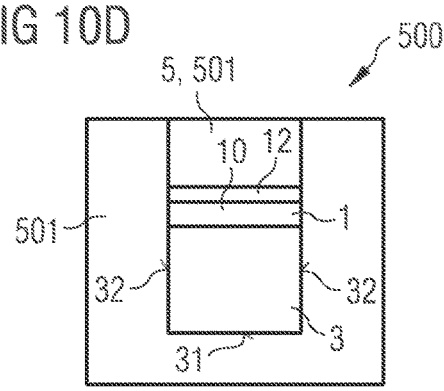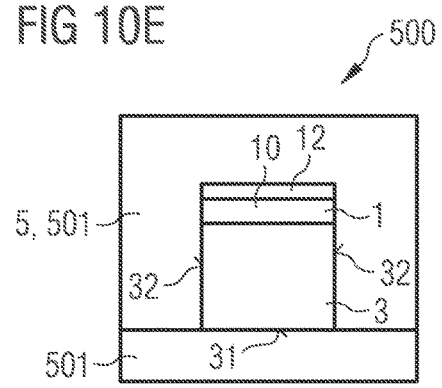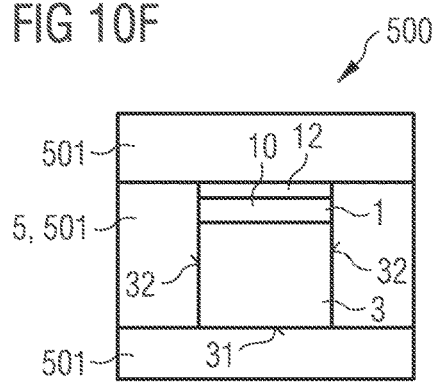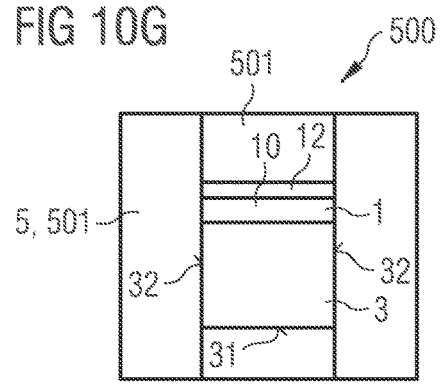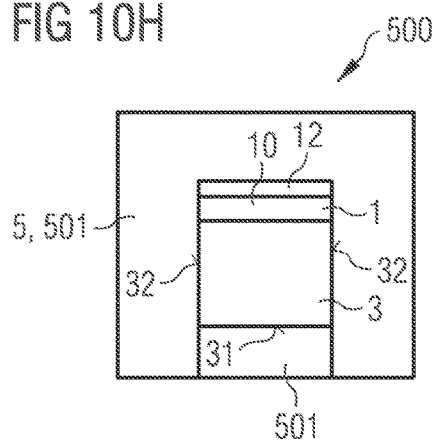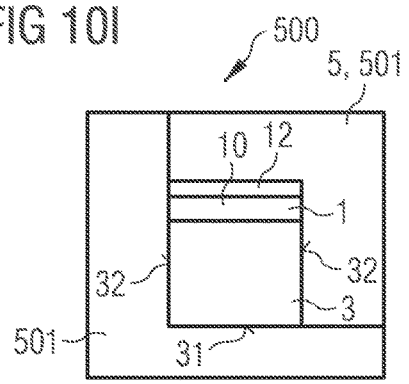

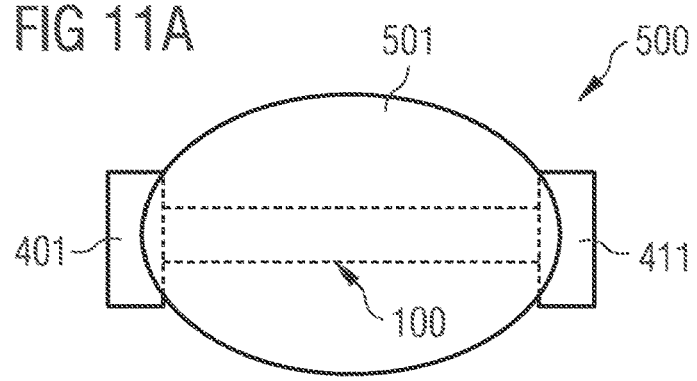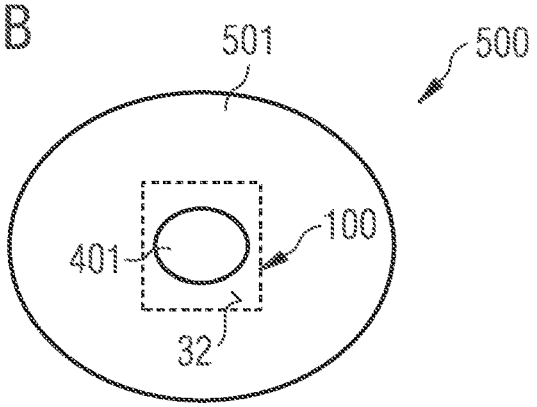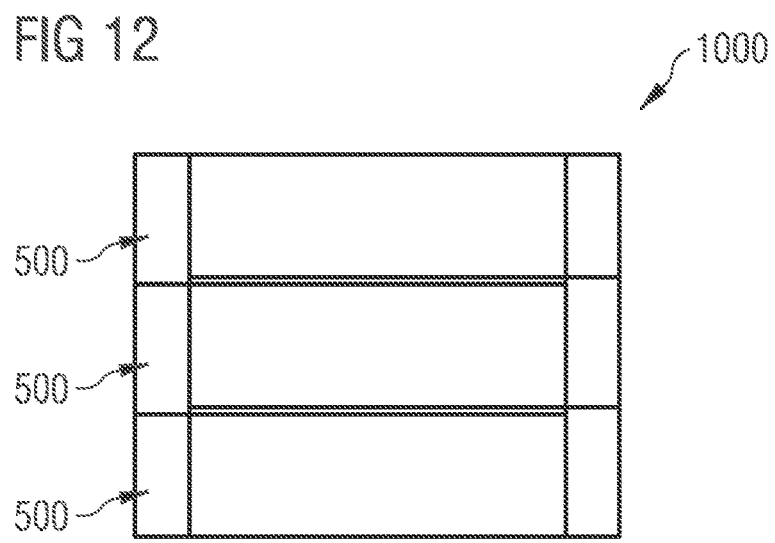

OPTOELECTRONIC SEMICONDUCTOR CHIP, OPTOELECTRONIC SEMICONDUCTOR COMPONENT AND METHOD FOR PRODUCING AN OPTOELECTRONIC SEMICONDUCTOR CHIP

This patent application is a national phase filing under section 371 of PCT/EP2016/056819, filed Mar. 29, 2016, which claims the priority of German patent application 10 2015 104 886.8, filed Mar. 30, 2015, each of which is incorporated herein by reference in its entirety.

TECHNICAL FIELD

An optoelectronic semiconductor chip is provided. Furthermore, a light-emitting diode, an optoelectronic semiconductor device and a method for producing an optoelectronic semiconductor chip and a light-emitting diode are provided.

SUMMARY OF THE INVENTION

Embodiments provide an optoelectronic semiconductor chip and a light-emitting diode with efficient radiation outcoupling by, for example, minimizing the shading area of contact structures. Further embodiments provide an optoelectronic device in which a plurality of the stated semiconductor chips and/or light-emitting diodes is processed. Yet other embodiments provide a method for producing such an optoelectronic semiconductor chip and such a light-emitting diode.

According to at least one embodiment, the optoelectronic semiconductor chip comprises a main body with a carrier and a semiconductor layer sequence arranged on a top of the carrier. The semiconductor layer sequence preferably extends continuously, cohesively and uninterruptedly over the top of the carrier and virtually completely covers the top of the carrier, for example, to an extent of at least 90% or 95% or 99%. The semiconductor layer sequence is designed, in correct operation, to emit or absorb electromagnetic radiation in particular in the visible wavelength range between 400 nm and 800 nm. The carrier is preferably formed in one piece.

The semiconductor layer sequence is based, for example, on a III-V compound semiconductor material. The semiconductor material is, for example, a nitride compound semiconductor material, such as $Al_nIn_{1-n-m}Ga_mN$, or a phosphide compound semiconductor material, such as $Al_nIn_{1-n-m}Ga_mP$ or indeed an arsenide compound semiconductor material, such as $Al_nIn_{1-n-m}Ga_mAs$, wherein in each case $0 \leq n \leq 1$, $0 \leq m \leq 1$ and $m+n \leq 1$. The semiconductor layer sequence may comprise dopants and additional constituents. For simplicity's sake, however, only the essential constituents of the crystal lattice of the semiconductor layer sequence are indicated, i.e., Al, As, Ga, In, N or P, even if these may in part be replaced and/or supplemented by small quantities of further substances. The semiconductor layer sequence is preferably based on AlInGaN.

The semiconductor layer sequence preferably comprises an active layer which includes at least one p-n junction and/or a quantum well structure in the form of an individual quantum well, or SQW for short, or in the form of a multi-quantum well structure, or MQW for short.

The carrier is preferably self-supporting and is designed to mechanically stabilize the main body. Other than the carrier, the main body thus then requires no further stabilization measures.

According to at least one embodiment, the optoelectronic semiconductor chip comprises two contact faces arranged on the semiconductor layer sequence and remote from the carrier, by means of which contact faces the semiconductor layer sequence is electrically contactable. The contact faces are thus arranged on sides of the semiconductor layer sequence remote from the carrier and extend, for example, substantially parallel to the top of the carrier. Electrically contactable here in particular means that the semiconductor layer sequence can be electrically contacted by means of the two contact faces. The contact faces are, for example, arranged on two mutually opposing peripheral regions of the top of the carrier and are preferably formed from a semiconductor material of the semiconductor layer sequence. Should the semiconductor layer sequence comprise more than two contact faces for electrical contacting, all these contact faces are, for example, arranged on sides of the semiconductor layer sequence remote from the carrier.

According to at least one embodiment, two contact elements are applied to the contact faces and electrically conductively connected therewith. The contact elements preferably serve to produce an electrical contact to the semiconductor layer sequence. To this end, the contact elements may, for example, comprise or consist of a metal or a metal alloy or a semiconductor material or a transparent, conductive material.

According to at least one embodiment, the carrier of the main body has side faces extending transversely of the top and a bottom opposite the top. The side faces thus connect the top with the bottom. In particular, the carrier may be cubic or cuboidal in shape, wherein the top and the bottom, for example, constitute main sides of the carrier, thus the sides with the largest areas in the main body. The bottom and the side faces of the carrier, for example, also simultaneously form a bottom and side faces of the main body.

According to at least one embodiment, the contact elements take the form of conductor tracks. The conductor tracks are here guided over edges of the main body onto the side faces of the carrier. In particular, starting from the contact faces, the conductor tracks thus in particular initially extend parallel to a main direction of extension of the semiconductor layer sequence, then bend over the edges of the main body and then extend parallel to the side faces of the carrier. Part of the semiconductor layer sequence is consequently preferably arranged between the contact elements and the carrier. In order to avoid short circuits between the contact elements and the semiconductor layer sequence in the region of the edges, the semiconductor layer sequence may be provided with passivation, for example, of $SiO_2$. The passivation is here, for example, already a component part of the main body.

In at least one embodiment, the optoelectronic semiconductor chip comprises a main body with a carrier and, arranged on a top of the carrier, a semiconductor layer sequence which, in correct operation, emits or absorbs electromagnetic radiation. The optoelectronic semiconductor chip furthermore comprises two contact faces arranged on the semiconductor layer sequence and remote from the carrier, by means of which contact faces the semiconductor layer sequence is electrically contactable. The semiconductor chip moreover comprises two contact elements which are applied to the contact faces and are electrically conductively connected therewith. The carrier of the main body comprises side faces extending transversely of the top and a bottom opposite the top. The contact elements take the form of conductor tracks which, starting from the contact faces, are guided over edges of the main body onto the side faces of the carrier.

The invention described here is based inter alia on the recognition that contact or bond wires which are conventionally used for contacting the semiconductor layer sequence bring about relatively significant shading of the radiation emitted by the semiconductor layer sequence. This is primarily because the contact wires do not lie flush or form-fittingly on the semiconductor chip, but instead arch out therefrom. This in turn results in a comparatively large length of the contact wires and is thus associated with a large shading area of the contact wires.

Moreover, due their geometric shape, the contact wires increase the lateral and vertical extents of the overall semiconductor device or semiconductor chip.

The invention described here makes use inter alia of the concept of providing the contact elements not as contact wires, but instead as conductor tracks which are guided from the contact faces onto the side faces of the main body and preferably lie form-fittingly and directly on the main body. As a consequence, the overall length and thus the shading area of the contact elements is reduced. Furthermore, because the contact elements lie flush and form-fittingly on the main body, both the vertical and the lateral extents of the overall semiconductor chip can be reduced.

In the invention, the contact elements are furthermore largely shifted from the semiconductor layer sequence onto the side faces and therefore a larger proportion of the area of the semiconductor layer sequence is available for light emission.

The conductor tracks may furthermore also serve for efficient outward heat transfer of the heat generated in the semiconductor chip.

Here and hereinafter, characteristics for both contact elements have been or are stated. These characteristics may, however, also in each case be met by only one of the contact elements.

According to at least one embodiment, the contact elements take the form of one-piece conductor tracks. In particular, the conductor tracks are thus formed from a single material or a single material composition. Alternatively, however, it is also possible for the conductor tracks to comprise a plurality of superposed layers of different materials, for example, different metals. In particular, the conductor tracks extend continuously, cohesively and uninterruptedly from the contact faces to the side faces.

According to at least one embodiment, the contact elements lie form-fittingly on the main body starting from the contact faces and continuing up to the side faces. This means, for example, that the contact elements lie form-fittingly on the main body in the entire region of the contact faces and the side faces and are thus in direct contact with the main body and no gaps or crevices are formed between the conductor tracks and the main body. The main body does not here necessarily consist solely of the carrier and the semiconductor layer sequence. Instead, both the carrier and the semiconductor layer sequence may be covered by further layers, for example, passivation layers and/or mirror layers, on which, for example, the conductor tracks then lie form-fittingly.

According to at least one embodiment, the carrier is a growth substrate for the semiconductor layer sequence. In other words, the carrier may consist of the growth substrate. The carrier may, for example, comprise or consist of sapphire or silicon or GaN or GaAs or SiC.

According to at least one embodiment, the contact elements are guided starting from the contact faces onto two mutually opposing side faces of the carrier.

According to at least one embodiment, except from the two side faces, all the remaining side faces of the carrier are free of conductor tracks and/or radiation-opaque coatings, such as metal coatings. Preferably, only two side faces of the carrier are thus covered or shaded by conductor tracks.

According to at least one embodiment, the contact elements, in particular all of the contact elements, are guided on the same side face of the carrier. The side face covered with the contact elements may then form a mounting or connecting face for the semiconductor chip. In particular, the semiconductor chip embodied in this manner may be used as a "side looker", in which a main direction of emission is parallel to the mounting face.

According to at least one embodiment, at least one side of the main body is covered with a mirror layer. The mirror layer may cover the corresponding side of the main body, for example, to an extent of at least 90% or 95% or completely. Preferably, all but one of the sides of the main body are covered, in particular completely covered, by the mirror layer. For example, all the side faces and the bottom of the carrier are covered with the mirror layer. Light is then predominantly or exclusively emitted via the uncovered side, for example, via a side of the semiconductor chip remote from the bottom of the carrier.

The mirror layer exhibits, for example, a reflectivity of at least 90% or 95% or 99% for the radiation emitted by the semiconductor layer sequence. To this end, the mirror layer, for example, assumes multilayer form, in particular as a Bragg reflector. The mirror layer is furthermore preferably arranged between a passivation layer and the carrier. In this manner, a short circuit via the mirror layer can be prevented, in particular in the event of the contact elements being applied to the mirror layer.

The mirror layer is, for example, formed as a multilayer mirror with the following layer sequence: ZnO/Ag/Pt/Au/SiN. The ZnO layer here faces the main body.

According to at least one embodiment, the mirror layer is patterned. This means that the mirror layer may comprise interruptions in which the main body or the carrier is not covered by the mirror layer, or the mirror layer is assumes non-cohesive form. The mirror layer is, for example, formed from individual strips. By means of such patterning, it is possible to adjust the emission behavior, emission intensity and angle dependence of the emitted radiation via the corresponding side of the main body or carrier.

For example, a pattern size of the patterning of the mirror layer may be of the order of magnitude of the wavelength emitted by the semiconductor layer sequence, thus, for example, between, inclusively, 0.5 times and twice the wavelength. The mirror layer can in this way have a light-guiding influence on the emitted radiation. Wavelength is in this case, for example, taken to mean a maximum wavelength, at which a maximum of the emitted radiant intensity occurs. The maximum wavelength is, for example, in the UV range between 200 nm and 400 nm inclusive or in the visible range between 400 nm and 800 nm inclusive.

According to at least one embodiment, a converter element is applied to the patterned mirror layer. Thanks to the combination of patterned mirror layer and converter element, the color of the emitted light can be influenced by means of the emission pattern established by the patterning. For example, due to the geometric shape of the semiconductor chip and converter element, light paths of differing length are obtained in the converter element. For example, the light emitted via edges of the semiconductor chip requires a longer path through the converter element. Using the patterned mirror layer, it is possible to establish preferred light paths in order to avoid color location shifts. This furthermore means that a very wide variety of methods can be used for applying the converter element, in particular including methods which do not permit dimensionally faithful or homogeneous or form-fitting coating of the main body.

According to at least one embodiment, the semiconductor chip is a sapphire volume emitter, in which the carrier is a sapphire carrier and the semiconductor layer sequence, preferably based on AlInGaN, is grown on the sapphire carrier. In a volume emitter, at least a proportion of the radiation generated in the semiconductor layer sequence is injected into the carrier and coupled back out of the carrier via the side faces and the bottom.

According to at least one embodiment, the semiconductor layer sequence comprises a first layer, facing the carrier, of a first conductivity type, for example, an n-doped or p-doped layer. The semiconductor layer sequence furthermore comprises a second layer, remote from the carrier, of a second conductivity type, for example, then a p-doped or n-doped layer. An active layer for emitting or absorbing radiation is arranged between the first layer and the second layer.

According to at least one embodiment, a second contact face is arranged on the second layer, hence remote from the carrier. The second layer may, for example, be electrically contactable by means of the second contact face.

According to at least one embodiment, a first contact face is arranged on the first layer in a recess in the semiconductor layer sequence. In the recess, the second layer and the active layer are removed and the first layer is revealed. The recess may, for example, be arranged at a periphery of the semiconductor layer sequence and include an edge of the main body. The recess is then not completely surrounded by a continuous and cohesive bed of the active layer and/or the second layer.

According to at least one embodiment, the first layer is electrically contactable by means of the first contact face.

The first contact face and the second contact face are thus preferably arranged on different planes offset from one another. The first contact face is hence closer to the carrier than the second contact face.

According to at least one embodiment, the contact elements lie directly on the corresponding side faces of the carrier and no further layers are arranged between the carrier and the contact elements. Alternatively, a thin layer or a thin layer stack, for example, of electrically insulating materials, may be arranged between the side faces of the carrier and the contact elements. The distance between the contact elements and the side faces covered thereby, for example, then in each case amounts to at most 1 µm or at most 500 nm or at most 200 nm.

According to at least one embodiment, the optoelectronic semiconductor chip is a thin-film semiconductor chip, in which the growth substrate is removed, the stabilizing carrier thus differing from the growth substrate. The carrier may then, for example, be a metal carrier or a silicon or germanium carrier.

According to at least one embodiment, the semiconductor chip and/or the carrier has the geometric basic shape of a rectangular prism with six bounding faces. In particular, a rectangular prism may here and hereinafter be a cuboid or cube. The bounding faces need not, however, necessarily extend parallel to one another in pairs, but instead the carrier may also be trapezoidal in a side or cross-sectional view, wherein the top and the bottom of the carrier extend substantially parallel and the top has a smaller lateral extent than the bottom or vice versa.

For example, the carrier has two mutually opposing end faces and two mutually opposing longitudinal sides, which form the side faces of the carrier. The end faces are, for example, smaller in area than the longitudinal sides and the top and the bottom. In particular, the edges surrounding the end faces of the carrier are shorter, for example, at most 70% as long or at most half as long or at most 30% as long as the other four edges of the carrier, such that the carrier has an elongate shape, on the ends of which are in each case arranged the end faces.

The contact elements are, for example, guided onto the two opposing end faces. Alternatively, the contact elements may also be guided onto the opposing longitudinal sides or onto one and the same longitudinal side.

According to at least one embodiment, radiation is emitted via all six bounding faces of the semiconductor chip in operation. A proportion of the radiation emitted in the semiconductor layer sequence is, for example, emitted directly out of the semiconductor chip in the direction away from the carrier. Another proportion which is emitted from the semiconductor layer sequence towards the carrier, for example, enters the carrier where it is scattered and coupled out of the semiconductor chip via all the side faces and the bottom of the carrier. In this manner, the semiconductor chip may thus emit radiation via all six bounding faces.

According to at least one embodiment, the proportion of the total surface area of the semiconductor chip via which radiation can be emitted in operation amounts to at least 90% or 95% or 99%.

According to at least one embodiment, the contact elements have a thickness perpendicular to the corresponding side faces of at least 100 nm or 200 nm or 300 nm. Alternatively or additionally, the thickness of the contact elements in each case amounts to at most 500 nm or at most 400 nm or at most 300 nm. Such a thickness may, for example, be achieved if the contact elements are applied to the main body by a sputtering or vapor deposition process. The thickness of the contact elements is here in particular taken to mean the average thickness or maximum thickness along the entire extent of the conductor tracks.

The thickness of the contact elements may, however, also be increased by an electroplating process, such that the thickness amounts to at least 2 µm or 5 µm or 10 µm. Alternatively or additionally, the thickness then amounts to at most 100 µm or at most 30 µm or at most 20 µm or at most 15 µm.

According to at least one embodiment, the contact elements on the semiconductor layer sequence have a width in the lateral direction parallel to the top of at least 5 µm or 10 µm or 20 µm. Alternatively or additionally, the width on the semiconductor layer sequence is at most 100 µm or at most 50 µm or 30 µm. In the region of the side faces, the contact elements have, for example, a width of at least 10 µm or 30 µm or 100 µm. Alternatively or additionally, the width of the contact elements in the region of the side faces is at most 400 µm or 300 µm or 100 µm. Like the thickness, the width can also be defined by the maximum or average width.

According to at least one embodiment, the materials from which the contact elements are formed have a specific thermal conductivity of at least 80 W/(m·K) or 100 W/(m·K) or 200 W/(m·K). The greater the selected thicknesses, widths and specific thermal conductivity values of the contact elements, the more effectively can the heat, for example, generated by the semiconductor chip in operation, be dissipated by means of the contact elements.

According to at least one embodiment, in plan view onto the semiconductor layer sequence, the contact faces and/or the contact elements cover at most 10% or 5% or 2% of the total area of the semiconductor layer sequence. Alternatively or additionally, the contact faces and/or the contact elements cover the semiconductor layer sequence to an extent of at least 0.5% or 1% or 1.5%. The remaining area of the semiconductor layer sequence here preferably serves to emit radiation in operation.

According to at least one embodiment, the contact elements cover the corresponding side faces of the carrier to an extent of at most 15% or 10% or 5% and alternatively or additionally to an extent of at least 1% or 3% or 5%. In this manner, in operation, sufficient radiation can also be emitted via the side faces of the carrier which are covered with the conductor tracks.

According to at least one embodiment, the contact elements comprise or consist of at least one metal from the following group: silver, aluminium, copper, nickel, platinum, titanium, zinc, palladium, molybdenum or tungsten. For example, the contact elements comprise a Ti(0.1 µm)/Pt(0.1 µm)/Au(0.1-1 µm) layer sequence or a Ti(0.1 µm)/Ni(1 µm)/Au(1 µm) layer sequence, the values stated between parentheses being possible layer thicknesses of the individual layers. The contact elements can be made thicker by electroplating, for example, with additional Cu electroplating.

It is also possible for the contact elements to comprise or consist of a transparent conductive material (transparent conductive oxides, TCO for short), such as indium-tin oxide, ITO for short, or ZnO. Transparent materials having a conductive metal mesh extending there through are also conceivable for the conductor tracks.

It is furthermore conceivable for the contact elements on the semiconductor layer sequence to be transparent, for example, to comprise or consist of one of the above materials, and to be metallic in the region of the side faces, for example, to comprise or consist of one of the above metals.

According to at least one embodiment, the contact elements are reflective to the radiation emitted by the semiconductor layer sequence. In particular, the contact elements then exhibit reflectivity of at least 80% or 90% or 95% for the radiation emitted by the semiconductor layer sequence.

According to at least one embodiment, the length of the contact elements transversely of the top, thus along the side faces, or measured from the top towards the bottom, amounts to at most 75% or at most 50% or at most 40% of the thickness of the carrier. The thickness of the carrier is here defined as the distance between top and bottom. In this embodiment, the contact elements are thus not guided from the top to the bottom of the carrier.

According to at least one embodiment, the contact elements are guided from the top to the bottom of the carrier.

According to at least one embodiment, in the region of the bottom, each of the contact elements comprises a connection region by means of which the semiconductor chip can be mounted on a connection carrier and/or be electrically contacted. In the connection region, the corresponding contact element is then preferably guided away laterally from the carrier as a bridge or foot. In this bottom region, the contact element then preferably extends parallel or substantially parallel to the bottom of the carrier.

According to at least one embodiment, in the direction away from the bottom, the connection region terminates flush with the bottom of the carrier. This means in particular that the connection region of the contact element and the bottom of the carrier form a common, preferably planar, bearing face of the supporting semiconductor chip, by means of which the semiconductor chip may, for example, be placed on a connection carrier.

According to at least one embodiment, a converter element is applied to the semiconductor layer sequence, which converter element converts at least a proportion of the radiation emitted by the semiconductor layer sequence into radiation of another wavelength range. The converter element may here, for example, be a ceramic converter element, the lateral extent of which is adapted to the lateral extent of the semiconductor chip, i.e., deviates from the latter lateral extent by less than 10%. It is also possible for the converter element to be a converter film which is placed onto the semiconductor layer sequence and accordingly cut to size.

In addition to the semiconductor layer sequence, the converter element may, however, also partially or completely cover the side faces of the carrier.

According to at least one embodiment, the converter element has a thickness of at most 70 µm or 50 µm or 30 µm. Alternatively or additionally, the thickness is at least 10 nm or 20 nm or 30 nm. The thermal characteristics of the entire semiconductor chip can be improved by a small thickness of the converter element layer.

According to at least one embodiment, a potting material, for example, a transparent potting material, is applied to the main body and the contact elements. The potting material may completely enclose the main body and the contact elements. The bottom of the main body and the connection regions of the contact elements are preferably partially or completely free of the potting material. The bottom of the carrier and the connection regions may then still be used for mounting and electrically contacting the semiconductor chip. The layer thickness of the potting material on the main body here, for example, amounts to between 100 µm and 500 µm inclusive.

The potting material may, but need not necessarily, have a stabilizing action on the semiconductor chip. The semiconductor chip is preferably self-supporting and mechanically stable even in the absence of a potting material. This means that just the main body with the contact elements is capable of forming a self-supporting semiconductor chip which requires no further stabilization measures.

According to at least one embodiment, the potting material comprises phosphor particles and is designed to convert a proportion of the radiation emitted by the semiconductor layer sequence into radiation of another wavelength range. The potting material may, for example, be a base material such as silicone or liquid silicone or resin or polymer or fluoropolymer or thermoplastic with phosphor particles, such as YAG:$Ce^{3+}$ or quantum dots, homogeneously distributed therein.

A light-emitting diode is furthermore provided. The light-emitting diode, for example, comprises a, in particular precisely one, semiconductor chip as described above. This means that all the features disclosed in relation to the optoelectronic semiconductor chip are also disclosed for the light-emitting diode and vice versa.

According to at least one embodiment of the light-emitting diode, the latter comprises two, in particular precisely two electrically conductive contact blocks. The contact blocks are applied to two, in particular to two opposing, side faces, preferably to end faces, of the carrier and may be in direct contact with the side faces. The contact blocks are, for example, applied to the same side faces as the contact elements.

The contact blocks, for example, comprise or consist of metal or a metal alloy, such as, for example, the material stated in connection with the contact elements. The contact blocks are, for example, formed in one piece. Preferably, however, the contact blocks are not formed in one piece with the contact elements. At least one interface which is discernible, at least on the crystal plane, at the transition between the contact blocks and the contact elements is thus formed between the contact elements and the contact blocks.

The contact blocks have, for example, a thickness, measured perpendicular to the corresponding side faces to which they are applied, of at least 5 µm or at least 10 µm or at least 30 µm or at least 100 µm or at least 500 µm. Alternatively or additionally, the thickness of the contact blocks amounts to at most 1 mm or at most 500 µm or at most 100 µm or at most 70 µm or at most 50 µm.

According to at least one embodiment, the contact blocks are electrically conductively connected with the contact elements. The contact blocks may be in direct mechanical contact with the contact elements or be electrically connected with the contact elements by means of a conductive material, such as a conductive adhesive or a solder material.

According to at least one embodiment, a sheathing is arranged around the main body in such a manner that the parts of the main body which are not covered by the contact blocks are entirely or partially covered by the sheathing. The sheathing in particular covers some or all of the sides of the semiconductor chip or main body which are not covered by the contact blocks. These sides are then preferably completely covered by the sheathing. The sheathing and the contact blocks thus preferably completely surround the semiconductor chip. The sheathing may be in direct contact with the carrier and/or the semiconductor layer sequence.

The sheathing may comprise or consist of a converter element as described above or a potting material with phosphor particles as described above. The sheathing may be formed in one-piece or alternatively comprise different regions, such as light-converting and opaque/light-reflecting regions. For example, the sheathing is light-converting in nature in the region of the semiconductor layer sequence, while the sheathing is opaque/light-reflecting in nature in the bottom region. The side faces covered by the sheathing, for example, the mutually opposing longitudinal sides, may be covered by opaque/light-reflecting sheathing or light-converting sheathing, depending on the desired emission pattern.

The opaque/light-reflecting region of the sheathing comprises, for example, a base material as stated above with $TiO_2$ particles dispersed therein. Reflectance for the radiation emitted by the semiconductor chip amounts, for example, to at least 95% or 99%, measured, for example, at the wavelength at which the radiant intensity of the semiconductor chip is at its maximum.

A sheathing of a transparent material, such as clear silicone, is also possible for the light-converting region. The sheathing may then comprise a converter material layer on a side of the transparent material remote from the semiconductor chip.

According to at least one embodiment, in the unmounted state of the light-emitting diode, the contact blocks on an outer face of the light-emitting diode are uncovered. The uncovered parts of the contact blocks may then serve, in correct operation, for external electrical contacting of the light-emitting diode.

The outer face of the light-emitting diode is preferably completely formed by the sheathing and the contact blocks. In the unmounted state of the light-emitting diode, the outer face, for example, adjoins a surrounding medium, such as air. The outer face is thus the outermost face of solid material which completely surrounds the unmounted light-emitting diode. The outer face thus forms the working face, by which the light-emitting diode can be picked up, held or touched, for example, in order to position the light-emitting diode.

According to at least one embodiment, the contact blocks completely cover the side faces of the carrier. Viewed in plan view onto the covered side faces, the contact blocks particularly preferably partially or completely project beyond the corresponding side faces. For example, the contact blocks project beyond the corresponding side faces at one or more or all of the edges of the corresponding side faces.

The contact blocks project beyond the edges of the corresponding side faces, for example, by at least 5 µm or 10 µm or 30 µm or 100 µm or 500 µm. Alternatively or additionally, the contact blocks project beyond the edges of the side faces by at most 1 mm or 500 µm or 100 µm or at most 70 µm or at most 50 µm.

Alternatively, however, it is also possible for the contact blocks to be smaller than the corresponding side faces and thus for only a proportion of the corresponding side faces to be covered by the contact blocks. The proportion of these side faces which is not covered by the contact blocks is then preferably likewise covered by the sheathing.

According to at least one embodiment, the sheathing terminates flush with the contact blocks on the outer face of the light-emitting diode. In other words, the contact blocks and the sheathing terminate flush with one another in directions away from the carrier. Accordingly, within the bounds of manufacturing tolerances, no step or kink is then formed on the outer face between the contact blocks and sheathing.

According to at least one embodiment, an outer face of the light-emitting diode which is smooth within the bounds of manufacturing tolerances is formed by the contact blocks and the sheathing, preferably solely by the contact blocks and sheathing. For example, the contact blocks, when viewed in plan view onto the side faces covered thereby, have a rectangular or circular or elliptical cross-sectional area. The sheathing may have a corresponding bounding face in order to ensure a flush transition from the contact elements to the sheathing on the outer face of the semiconductor chip. For example, the outer face of the light-emitting diode formed by the contact blocks and sheathing has the geometric shape of the outer face of a rectangular prism or cylinder or egg or ellipsoid.

The light-emitting diodes provided in this manner may be used as light-emitting building blocks which, by electrically connecting the individual light-emitting diodes, for example, by soldering or adhesively bonding the light-emitting diodes together, form a larger light-emitting diode with a freely adjustable shape. The semiconductor chips in the light-emitting diodes are protected from external influences by the sheathing and the contact blocks.

An optoelectronic semiconductor device is furthermore provided. The semiconductor device, for example, comprises a semiconductor chip as described above and/or a light-emitting diode as described above. This means that all the features disclosed in relation to the optoelectronic semiconductor chip and the light-emitting diode are also disclosed for the optoelectronic semiconductor device and vice versa.

According to at least one embodiment, the optoelectronic semiconductor device comprises at least two of the above-described semiconductor chips and/or light-emitting diodes, wherein a contact element of one semiconductor chip is electrically conductively connected with a contact element of a further semiconductor chip. The side faces provided with contact elements of two adjacent semiconductor chips then preferably face one another. The semiconductor chips are in particular connected in series as a result. It is also possible for a plurality, for example, at least three or five or ten of the above-stated semiconductor chips and/or light-emitting diodes to be connected in series by means of the lateral contact elements so as to form a semiconductor chip chain or light-emitting diode chain. Alternatively, the semiconductor chips or light-emitting diodes may also be connected in parallel, for example, by stacking the semiconductor chips or light-emitting diodes on one another.

According to at least one embodiment, the contact elements or contact blocks of two adjacent semiconductor chips or light-emitting diodes are in direct mechanical and electrical contact with one another. The contact elements or contact blocks of adjacent semiconductor chips or adjacent light-emitting diodes are then, for example, electrically conductively and mechanically stably connected together merely by means of a solder material. In this manner, it is possible to obtain a compact chain or a compact stack semiconductor chips or light-emitting diodes connected in series or parallel.

A method for producing an optoelectronic semiconductor chip is furthermore provided. The method is in particular suitable for producing an optoelectronic semiconductor chip as described above. This means that all the features disclosed in relation to the semiconductor chip are also disclosed for the method and vice versa.

According to at least one embodiment, the method comprises a step A), in which a main body is provided which comprises a carrier with a top, a bottom opposite the top and side faces extending transversely of the top, wherein the side faces connect the top and the bottom with one another. The main body moreover comprises, applied to the top of the carrier, a semiconductor layer sequence which, in correct operation, emits or absorbs electromagnetic radiation.

According to at least one embodiment, the method comprises a step B), in which the main body is applied to an auxiliary carrier, such that the semiconductor layer sequence is remote from the auxiliary carrier. The carrier of the main body is thus then arranged between the auxiliary carrier and the semiconductor layer sequence.

According to at least one embodiment, in a step C) a protective layer is applied to the main body in such a manner that at least contact faces on the semiconductor layer sequence which are remote from the carrier remain free of the protective layer. The contact faces are intended subsequently to serve for electrically contacting the semiconductor layer sequence.

According to at least one embodiment, in a step D) an electrically conductive layer is applied to the protective layer, the contact faces and side faces of the carrier. All the regions of the main body which are not covered by the protective layer are here preferably covered by the electrically conductive layer. The electrically conductive layer here preferably extends cohesively, continuously and uninterruptedly.

According to at least one embodiment, in a step E) the protective layer with the electrically conductive layer located thereon is detached, such that contact elements in the form of conductor tracks are obtained or remain behind which, starting from the contact faces, are guided over edges of the main body onto side faces of the carrier and here lie form-fittingly on the main body.

In which the method described here, the subsequent pattern of the conductor tracks on the main body is thus defined by means of the pattern of the protective layer. Regions in which the conductor tracks are subsequently to extend are not protected by the protective layer, such that the electrically conductive layer is applied to these regions.

The electrically conductive layer is applied, for example, by means of a sputtering process or a vapor deposition process and/or an electroplating process.

According to at least one embodiment, steps A) to E) are carried out in the stated sequence.

According to at least one embodiment, in step C) the protective layer is initially applied in the form of a photoresist onto the main body and the auxiliary carrier. The photoresist here preferably covers the entire main body and sub-regions of the auxiliary carrier, such that no regions of the main body are uncovered.

According to at least one embodiment, in a subsequent step the photoresist is patterned, for example, by means of an exposure process with the assistance of a mask, in such a manner that the regions of the main body and the auxiliary carrier which are subsequently to be covered by the contact elements are revealed, i.e., are free of photoresist. The patterned photoresist with the applied electrically conductive layer may be removed in step E), for example, by being rinsed off with a solvent.

According to at least one embodiment, after step E) the main body provided with the contact elements is covered with a converter element in the form of a converter film or a potting composition.

According to at least one embodiment, after step E) the auxiliary carrier is detached from the main body, such that an individual semiconductor chip without auxiliary carrier is obtained.

A method for producing a light-emitting diode is furthermore provided. The method is in particular suitable for producing a light-emitting diode as described above. This means that all the features disclosed in relation to the light-emitting diode are also disclosed for the method for producing the light-emitting diode and vice versa.

According to at least one embodiment, after step E) contact blocks are applied to two side faces of the carrier. The contact blocks are preferably brought into direct mechanical contact with the side faces of the carrier. The contact blocks are electrically conductively connected with the contact elements, for example, by means of a solder material or an electrically conductive adhesive.

Then, in a further step, all the regions of the semiconductor chip which are not covered by the contact blocks are preferably completely surrounded by sheathing, wherein in each case an outer face of the light-emitting diodes is obtained. The outer face is preferably completely formed by the sheathing and by the contact blocks.

Applying the sheathing may proceed in one or a plurality of steps.

BRIEF DESCRIPTION OF THE DRAWINGS

An optoelectronic semiconductor chip described herein, a light-emitting diode described herein, an optoelectronic semiconductor device described herein and a method for producing an optoelectronic semiconductor chip and a light-emitting diode are explained in greater detail below on the basis of exemplary embodiments with reference to drawings. Elements which are the same in the individual figures are indicated with the same reference numerals. The relationships between the elements are not shown to scale, however, but rather individual elements may be shown exaggeratedly large to assist in understanding.

In the figures:

FIGS. 1A to 1F and 6A to 6F show various method steps for producing an exemplary embodiment of an optoelectronic semiconductor chip, FIG. 1G shows a prior art optoelectronic semiconductor chip in cross-sectional view, FIG. 1H shows a portion of an exemplary embodiment of an optoelectronic semiconductor chip in cross-sectional view, FIGS. 2A to 3A and 7A to 7D show exemplary embodiments of an optoelectronic semiconductor chip in 3D views and side views, FIGS. 3B to 4C show 12 exemplary embodiments of an optoelectronic semiconductor device in various views, FIGS. 8A, 8B, 9A, 10A show exemplary embodiments of a light-emitting diode in various 3D views, FIGS. 9B to 9E and 10B to 10I show various exemplary embodiments of a light-emitting diode in different cross-sectional views, FIGS. 11A and 11B show exemplary embodiments of a light-emitting diode in various side views, FIG. 12 shows an exemplary embodiment of an optoelectronic semiconductor device in which a plurality of light-emitting diodes are stacked on one another.

DETAILED DESCRIPTION OF ILLUSTRATIVE EMBODIMENTS

Figure 1A:
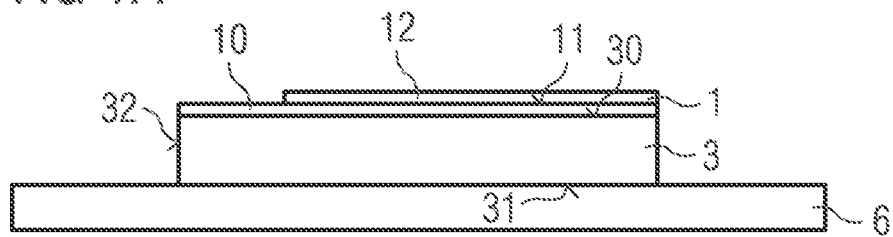

FIG. 1A shows a first method step for producing an exemplary embodiment of an optoelectronic semiconductor chip 100 in cross-sectional view. A main body with a carrier 3 and a semiconductor layer sequence 1 are here applied to an auxiliary carrier 6. The auxiliary carrier 6 is, for example, a glass substrate or a metal substrate or a semiconductor substrate.

In the present case, the semiconductor layer sequence 1 is applied to a top 30 of the carrier 3 remote from the auxiliary carrier 6. The carrier 3 furthermore comprises a bottom 31 opposite the top 30 and side faces 32 extending transversely of the top 30 which connect the bottom 31 with the top 30. The carrier 3 is, for example, a sapphire carrier which is simultaneously the growth substrate for the semiconductor layer sequence 1. The semiconductor layer sequence 1 itself comprises a first layer 10, facing the carrier 3, of a first conductivity type and a layer 12, applied to the first layer 10, of a second conductivity type.

The first layer 10 is, for example, n-conductive, the second layer 12 p-conductive. In the present case, the semiconductor layer sequence 1 is, for example, based on AlInGaN. Moreover, between the first layer 10 and the second layer 12, an active layer 11 is arranged which, in correct operation of the semiconductor layer sequence 1, emits or absorbs electromagnetic radiation. The active layer 11 may, for example, be a p-n junction or comprise a quantum well structure.

It is moreover apparent from FIG. 1A that, in a peripheral region of the semiconductor layer sequence 1, the second layer 12 and the active layer 11 has been removed in places, such that a recess is formed in the semiconductor layer sequence 1 in which the first layer 10 is uncovered.

In the present case, the semiconductor layer sequence 1 extends cohesively and uninterruptedly along the entire lateral extent parallel to the top 30 of the carrier 3.

Figure 1B:
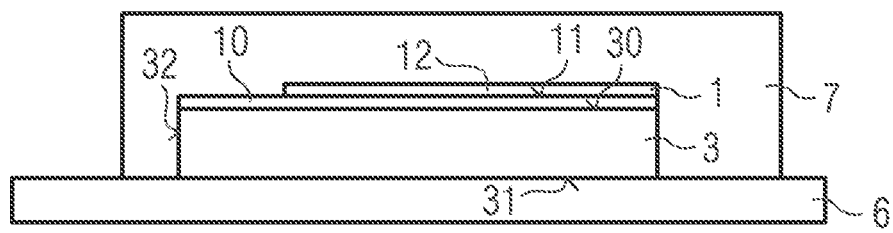

FIG. 1B shows a further method step, in which a protective layer 7 is applied to the main body and the auxiliary carrier 6. The protective layer 7 here preferably completely covers the main body on all the sides not covered by the auxiliary carrier 6. The protective layer 7 is, for example, a photoresist.

Figure 1C:
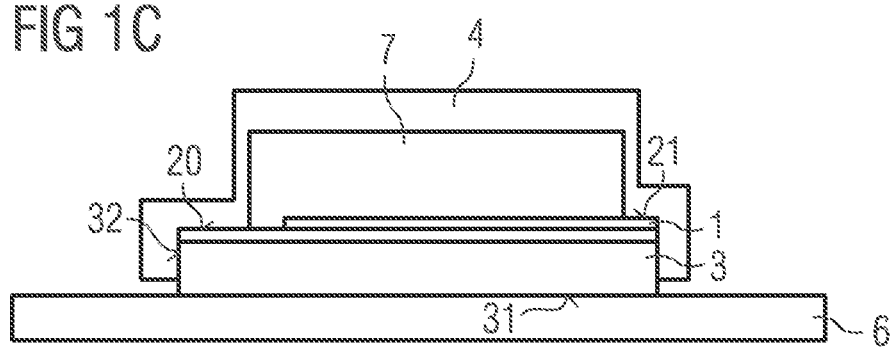

FIG. 1C shows a method step in which the protective layer 7 has been patterned, for example, with the assistance of a photolithographic process. As a result of the patterning, specific regions of the main body are revealed by the protective layer 7. Contact faces 20, 21 on the semiconductor layer sequence 1, which are remote from the carrier 3, and sub-regions of the side faces 32 are revealed and not covered by the protective layer 7. A first contact face 20 is here arranged within the above-mentioned recess, in which the first layer 10 is revealed. The second layer 12 is revealed in the region of a second contact face 21. The first contact face 20 and second contact face 21 are here arranged on opposing sides of the top 30. The contact faces 20, 21 furthermore extend up to edges of the main body.

Moreover in FIG. 1C, an electrically conductive layer 4 has already been applied to the protective layer 7 and the main body. The electrically conductive layer 4 here covers all the regions of the main body which are not covered by the protective layer 7. In the present case, the protective layer 7 thus in particular partially covers the contact faces 20, 21 and two opposing side faces 32 of the carrier 3.

Figure 1D:
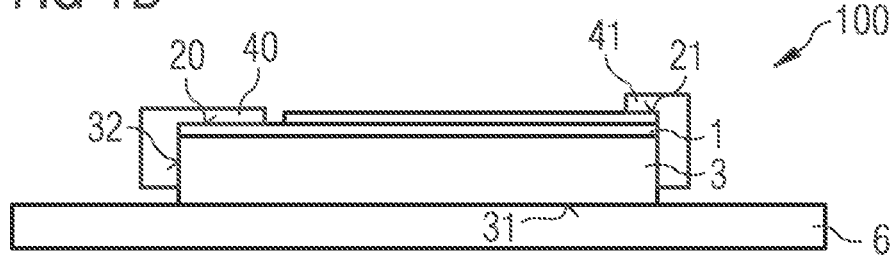

FIG. 1D shows a method step, in which the protective layer 7 with the electrically conductive layer 4 located thereon has been removed, for example, by means of a solvent. As a result, sub-regions of the electrically conductive layer 4 have remained behind on the main body and, in the present case, form contact elements 40, 41. A first contact element 40 here takes the form of a conductor track which extends from the first contact face 20 over an edge of the main body to a side face 32 of the carrier 3. A second contact element 41 is arranged on the second contact face 21 and extends from this second contact face 21 over an edge of the main body to a further side face 32 of the carrier 3. In the present case, the contact elements 40, 41 do not reach to the bottom 31 of the carrier 3.

In the region of the contact faces 20, 21 and the corresponding side faces 32, the contact elements 40, 41 here lie form-fittingly on the main body. The contact elements 40, 41 are furthermore formed cohesively and uninterruptedly in one piece.

The contact faces 20, 21 and thus the entire semiconductor layer sequence 1 may be electrically contacted by means of the contact elements 40, 41. The contact elements 40, 41 are conductor tracks which, for example, have a thickness of between 10 μm and 30 μm and, for example, consist of aluminium, silver or copper. In order to achieve sufficient thickness of the contact elements 40, 41, the contact elements 40, 41 can be made thicker, for example, by electroplating. A Ti/Pt/Cu or Ti/Pd/Cu or Pd/Cu layer sequence is, for example, possible, wherein the Cu layer is applied by electroplating.

FIG. 1D shows an exemplary embodiment of a finished optoelectronic semiconductor chip 100 which is still mounted on the auxiliary carrier 6.

In FIG. 1E, the auxiliary carrier 6 has been removed from the semiconductor chip 100. The semiconductor chip 100 is preferably self-supporting. In contrast with FIG. 1D, the contact elements 40, 41 are now guided to the bottom 31 of the carrier 3. In the region of the bottom 31, the contact elements 40, 41 comprise connection regions 400, by means of which the semiconductor chip 100 can be mounted on a connection carrier. In the connection regions 400, the contact elements 40, 41 are guided away from the carrier 3 as bridges or feet. The contact elements 40, 41 furthermore terminate in the connection regions 400 flush with the bottom 31 of the carrier 3. The connection regions 400 may thus, together with the bottom 31 of the carrier 3, form a mounting or bearing face for a connection carrier.

A potting material 50 is furthermore applied to the main body and to the contact elements 40, 41, which material completely covers the main body and the contact elements 40, 41 except on the bottom 31 and on the connection regions 400. The potting body 50 may, for example, be a silicone or resin which is provided with phosphor particles which convert a proportion of the radiation emitted by the semiconductor layer sequence 1 into radiation of another wavelength range.

The thickness of the potting material 50 perpendicular to the top 30 of the carrier 3, for example, amounts to between 100 µm and 300 µm inclusive.

The exemplary embodiment of FIG. 1F shows an optoelectronic semiconductor chip 100 which, with regard to the contact elements 40, 41 and the main body, is of identical construction to the semiconductor chip 100 of FIG. 1E. In contrast with FIG. 1E, no potting material 50 is applied to the main body and the contact elements 40, 41 but instead a converter element 5 in the form of a converter film or a ceramic converter plate. The converter element 5 has, for example, a layer thickness perpendicular to the top 30 of the carrier 3 of at most 50 µm and at least partially covers both the semiconductor layer sequence 1 and the side faces 32. In comparison with the potting material 50 of FIG. 1E, the converter element 5 of FIG. 1F has better thermal coupling to the sapphire carrier 3 due to its smaller thickness. The semiconductor chip 100 of FIG. 1F is likewise preferably self-supporting.

FIG. 1G shows a prior art semiconductor chip in cross-sectional view. In this case, the main body is not electrically contacted with the semiconductor layer sequence by means of conductor tracks 40, 41, but instead by means of contact or bond wires. Due to their curved geometric shape, the contact wires cause substantially greater shading of the light emitted by the semiconductor layer sequence 1 than do the conductor tracks 40, 41. Moreover, as is apparent from FIG. 1F, each contact wire is curved and projects over the semiconductor layer sequence. As a consequence, it is not possible to use a converter element 5 which is as thin as that in FIG. 1F. Instead, similarly to FIG. 1E, a potting compound is necessary here, the thickness of which is conventionally greater than 100 µm, as a result of which thermal coupling to the carrier is reduced in comparison with a thin converter element.

FIG. 1H shows a portion of an exemplary embodiment of an optoelectronic semiconductor chip 100 in cross-sectional view. The main body, which is covered by a converter element 5 in the form of a converter film both on the side faces 32 and on the top 30 of the carrier 3, is visible. The converter film has a thickness of, for example, 50 µm.

Figure 1I:
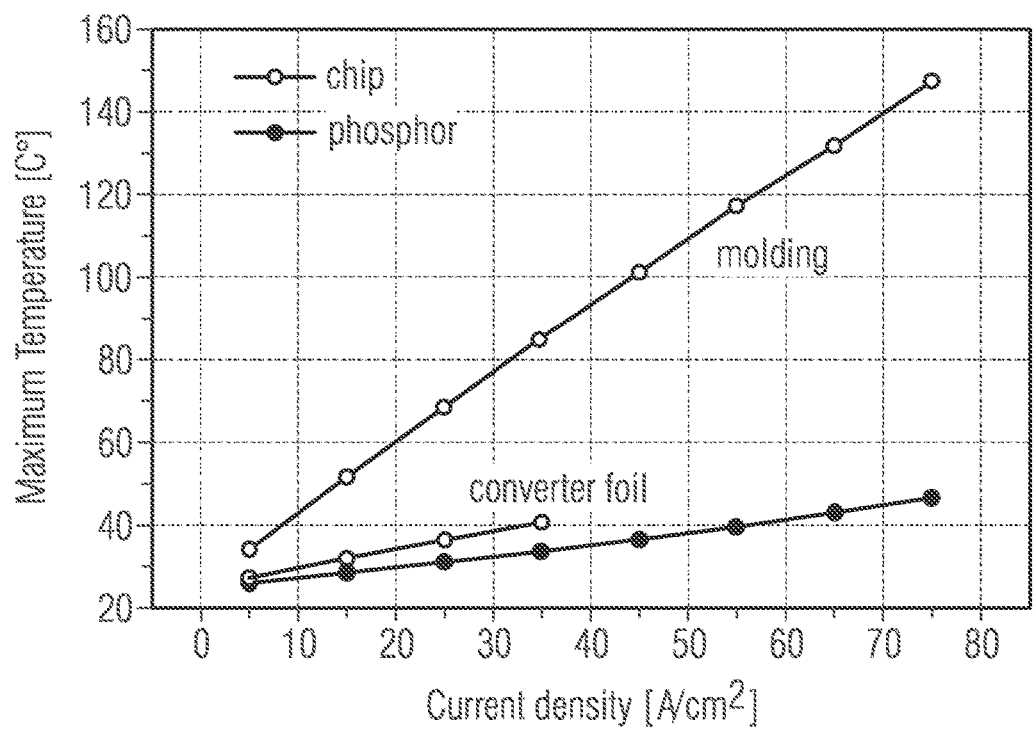
FIG. 1I shows a graph with measured temperature values for various exemplary embodiments of an optoelectronic semiconductor chip.

FIG. 1I shows a diagram comparing the thermal characteristics of semiconductor chips which are covered either with a potting composition or a converter film. The temperature of a semiconductor chip as a function of the supplied current density is shown. The solid dots are measured values for a semiconductor chip to which neither a converter film nor a potting material is applied. The hollow dots show, in one case, the temperature behavior when a converter film with a layer thickness of 50 µm is used and in another case, when a semiconductor chip with a potting composition of a thickness of 250 µm is used.

As is apparent from the graph of FIG. 1I, when a potting composition is used, the semiconductor chip gets substantially hotter than when a thin, 50 µm converter film is used.

FIG. 2A shows an exemplary embodiment of an optoelectronic semiconductor chip 100 in 3D view. The semiconductor chip 100 has the geometric shape of a rectangular prism with six bounding faces, wherein, in operation, electromagnetic radiation is coupled out via all of these bounding faces. It is apparent that the side faces 32 of the carrier 3 which are covered with the contact elements 40, 41 are only partially covered, for example, to an extent of at most 10%, by the contact elements 40, 41. The contact elements 40, 41 here have, for example, a width parallel to the top 30 of the carrier of at most 30 µm. In the present case, the proportion of the total surface area of the semiconductor chip 100, via which radiation is emitted in operation, is at least 99%.

The semiconductor layer sequence 1 applied to the carrier 3 moreover comprises current distribution structures 101, 121, by means of which the current supplied via the contact elements 40, 41 can be effectively distributed along the semiconductor layer sequence 1.

FIG. 2B shows the same optoelectronic semiconductor chip 100 as in FIG. 2A, but from other perspectives.

FIG. 2C shows an exemplary embodiment in which, in contrast with the exemplary embodiments of FIGS. 2A and 2B, the contact elements 40, 41 are guided to the bottom 31 of the carrier 3 and, in the region of the bottom 31, are guided away from the carrier 3 as bridges or feet. In the present case, these bridges or feet form connection regions 400, by means of which the semiconductor chip 100 may, for example, be mounted on a connection carrier.

Moreover, in FIG. 2C, a potting material 50 is applied to the main body and the contact elements 40, 41 in such way that, except for the bottom 31 and the connection regions 400, the main body and the contact elements 40, 41 are completely covered by the potting material 50. The potting material 50 is, however, only optional and the semiconductor chip 100 is usable and self-supporting even in the absence of the potting material.

FIG. 2D shows the same semiconductor chip 100 as in FIG. 2C, the view now being directed onto the bottom 31 of the carrier 3. As is apparent from FIG. 2D, in the region of the connection regions 400, the contact elements 40, 41 terminate flush with the bottom 31, such that preferably a planar face is formed by the bottom 31 and the connection regions 400, by means of which the semiconductor chip 100 can be mounted on a connection carrier and electrically contacted. In FIG. 2D, the connection regions 400 and the bottom 31 are revealed and are not covered by the potting material 50.

Figure 3A:
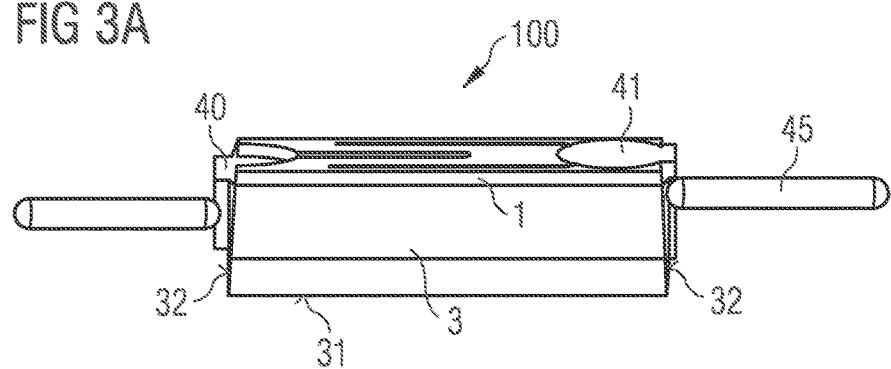

FIG. 3A shows the semiconductor chip 100 of FIGS. 2A and 2B. In addition, in the semiconductor chip 100 of FIG.

3A, a connecting element 45 is applied to each of the contact elements 40, 41, each connecting element extending out from the contact elements 40, 41 in the direction away from the semiconductor chip 100. In the present case, the connecting elements 45 take the form of connecting rods which are, for example, formed from a metal such as gold, silver, copper, nickel or aluminium.

Figure 3B:
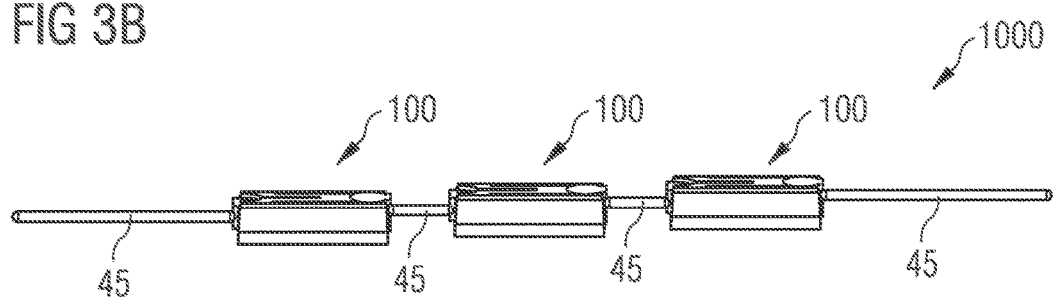

FIG. 3B shows an exemplary embodiment of an optoelectronic semiconductor device 1000 in 3D view in which three of the optoelectronic semiconductor chips 100 described in FIG. 3A are connected together in series via the connecting elements 45. The connecting elements 45 here each connect a first contact element 40 of a semiconductor chip 100 with a second contact element 41 of an adjacent second semiconductor chip 100. The connecting elements 45 are, for example, adhesively bonded or soldered to the contact elements 40, 41.

The semiconductor device 1000 of FIG. 3B forms a rod-like light-emitting element of a plurality of semiconductor chips 100 which can be energized or contacted via just two electrical connections. The semiconductor chips 100 are connected together in series by the connecting elements 45.

Figure 4A:
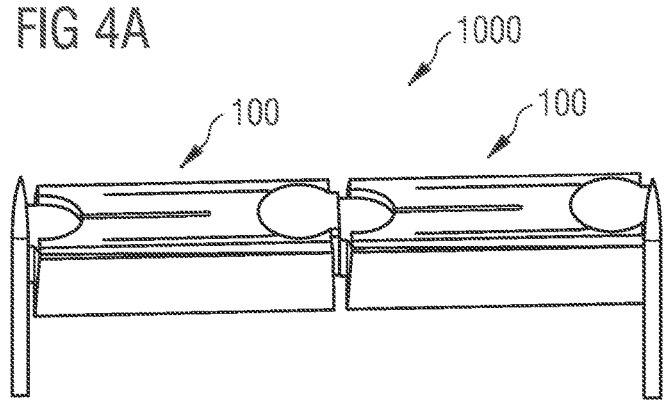

FIG. 4A shows a further exemplary embodiment of an optoelectronic semiconductor device 1000 in 3D view. In contrast with the preceding exemplary embodiment, two optoelectronic semiconductor chips 100 are now connected in series without interposed connecting elements 45. The contact elements 40, 41 of two adjacent semiconductor chips 100 are placed directly against one another and electrically conductively and mechanically stably connected together, for example, by means of a conductive adhesive or a solder.

Figure 4B:
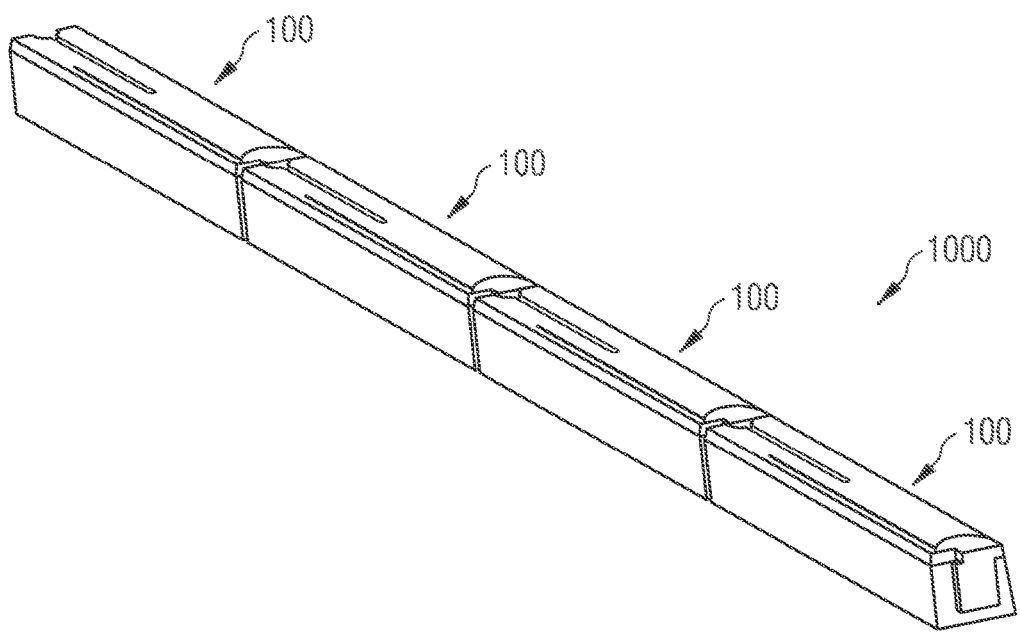

The exemplary embodiment of a semiconductor device 1000 of FIG. 4B differs from that of FIG. 4A in that now four semiconductor chips 100 are connected together in series by direct application of the contact elements 40, 41. FIG. 4B shows a rod- or filament-shaped light-emitting element obtained in this manner. It is also apparent that the semiconductor chips 100 have side faces 32 which extend obliquely to the top 30. Two opposing side faces 32 provided with contact elements 40, 41 of a semiconductor chip 100 are preferably inclined in the same direction. This has the consequence that the semiconductor chips 100 of FIG. 4B can only be placed against one another in such a way that the side faces 32 lie flush against one another. In this manner, it is possible to achieve pole protection in the semiconductor device 1000. The individual semiconductor chips can be electrically and mechanically connected, for example, by means of solder pads, such as AuSn pads. The solder pads can be fused, for example, by pressing the semiconductor chips 100 together at temperatures of around 300° C.

Figure 4C:
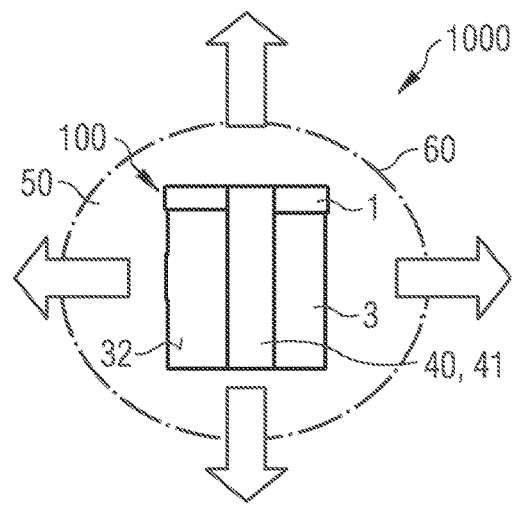

FIG. 4C shows a cross-sectional view of an optoelectronic semiconductor device 1000 as shown in FIG. 4B. The view is here directed onto a side face 32, covered with a contact element 40, 41, of a semiconductor chip 100. The series-connected semiconductor chips 100 are arranged in a tube 60, the main direction of extension of which extends parallel to the main direction of extension of the series-connected semiconductor chip 100. The tube 60 is, for example, a hollow cylinder made of glass with a circular or elliptical cross-sectional area. Between the semiconductor chip 100 and the circumferential surface of the tube 60 is arranged a potting material 50 which fills the interstices between the semiconductor chips 100 and the tube 60, imparting mechanical stability to the semiconductor chips 100 in the tube and holding them in position. The potting material 50 may, for example, be a clear, in particular transparent material, such as silicone or resin. It is also possible for the potting material 50 to be provided with phosphor particles which convert a proportion of the radiation emitted by the semiconductor chip 100 into radiation of another wavelength range. Alternatively or additionally, it is also possible for a converter material to be applied to the circumferential surface of the tube 60.

As is apparent from FIG. 4C, the optoelectronic semiconductor device shown therein is capable of emitting light via the entire cylindrical circumferential surface of the tube 60. A tube light made of LEDs may, for example, be obtained in this manner.

Figure 5:
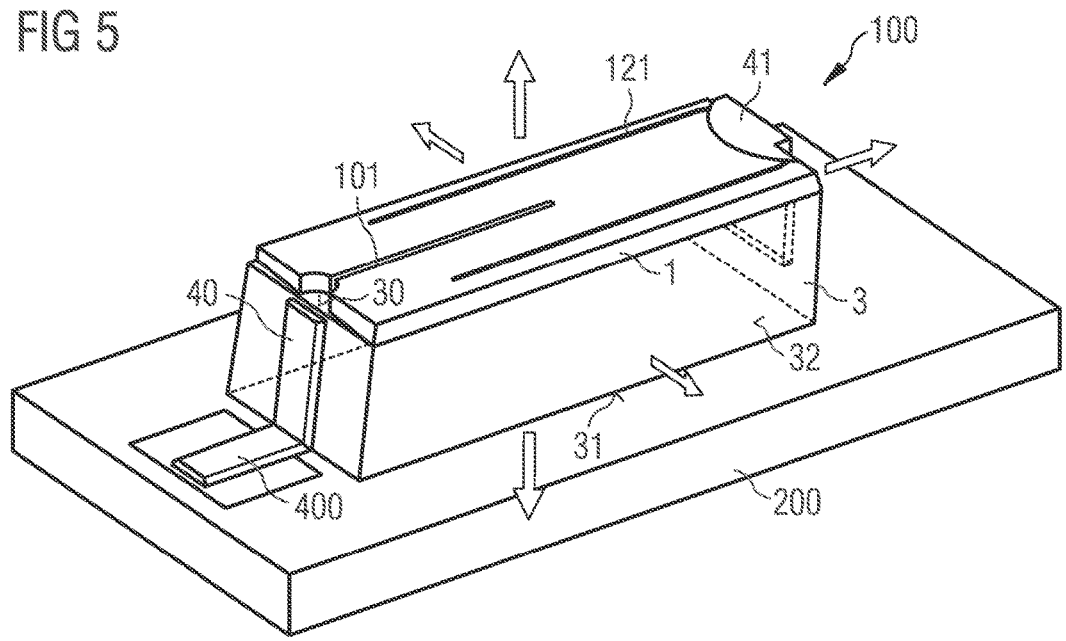
FIG. 5 shows an optoelectronic semiconductor chip which is mounted on a connection carrier in 3D view.

FIG. 5 shows an optoelectronic semiconductor chip 100, as discussed in connection with FIGS. 2A and 2B, which is arranged on a connection carrier 200. In contrast with FIGS. 2A and 2B, in FIG. 5 at least one of the contact elements 40, 41 is guided from the top 30 to the bottom 31 of the carrier 3 and, in a connection region 400, guided away from the carrier 3 as a bridge. In the region of the connection region 400, the contact element 40 lies on the connection carrier 200 and can be electrically contacted with a contact region of the carrier 200. The connection carrier 200 is, for example, a printed circuit board or an active matrix element, in particular made from a clear or transparent material.

Figure 6A:
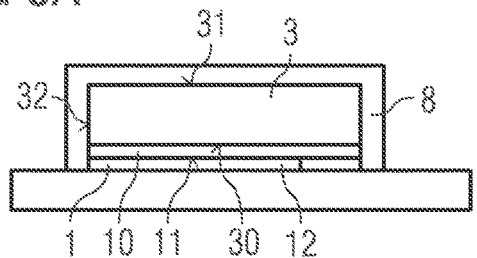
Figure 6B:
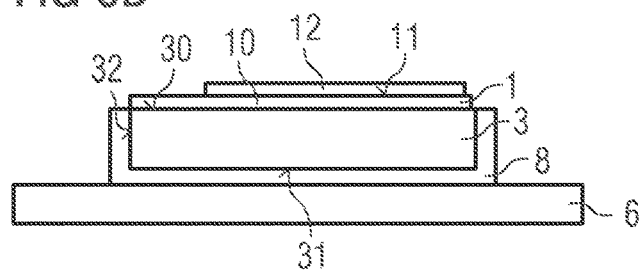
Figure 6C:
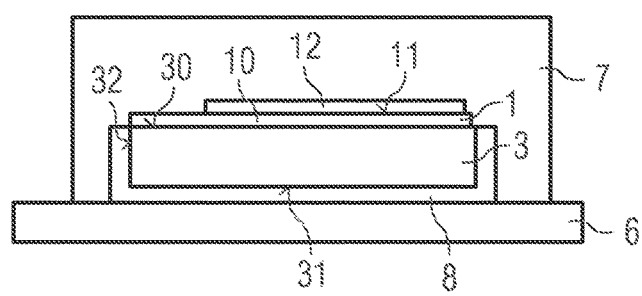
Figure 6D:
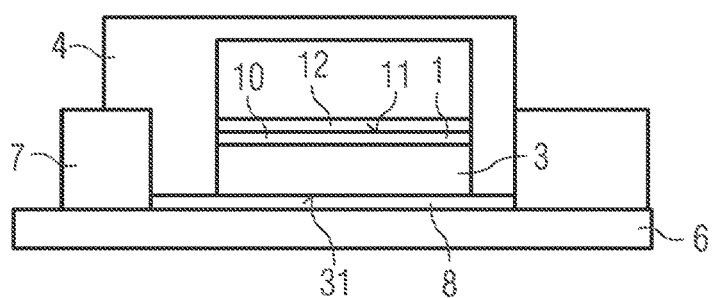
Figure 6E:
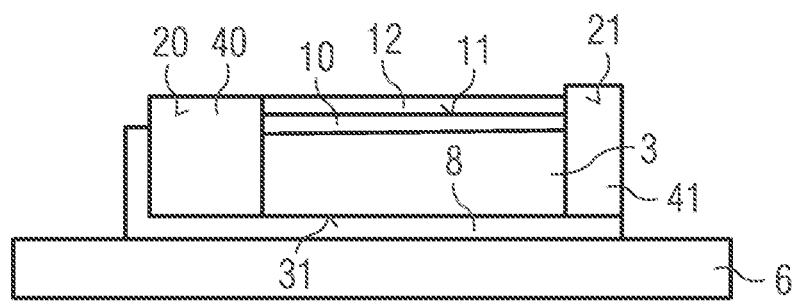

FIG. 6A shows a method step for producing an exemplary embodiment of a semiconductor chip 100 in which a main body as described in connection with FIG. 1A is firstly arranged on an intermediate carrier. The semiconductor layer sequence 1 faces the intermediate carrier. Moreover, all the sides of the main body remote from the intermediate carrier, in particular the side faces 32 and the bottom 31 of the carrier 3, are covered with a cohesive and uninterrupted mirror layer 8.

The main body with the mirror layer 8 is then detached from the intermediate carrier and the method steps shown in FIGS. 6B to 6E are carried out. These method steps are substantially identical to the method steps shown in FIGS. 1A to 1D. In contrast with FIG. 1, the contact elements 40, 41 are here, however, not provided on two opposing side faces 32 but the contact elements 40, 41 are instead guided from the contact faces 20, 21 onto the same side face 32, as is apparent from FIG. 6E. The other three side faces 32 are then free of contact elements 40, 41. The contact elements 40, 41 are here applied to the mirror layer 8, but are electrically insulated from the mirror layer 8, for example, by a passivation layer, such as SiN or SiO$_2$.

Alternatively or additionally to the passivation layer, it is however also conceivable for the mirror layer 8 to be patterned such that short circuiting does not occur, either because no electrical contact arises between the mirror layer 8 and the contact elements 40, 41 or because the mirror layer 8 is patterned to for an n-region and a p-region which, while they are each in themselves electrically conductively connected with one of the contact elements 40, 41, they are not in electrical contact with one another.

Figure 6F:
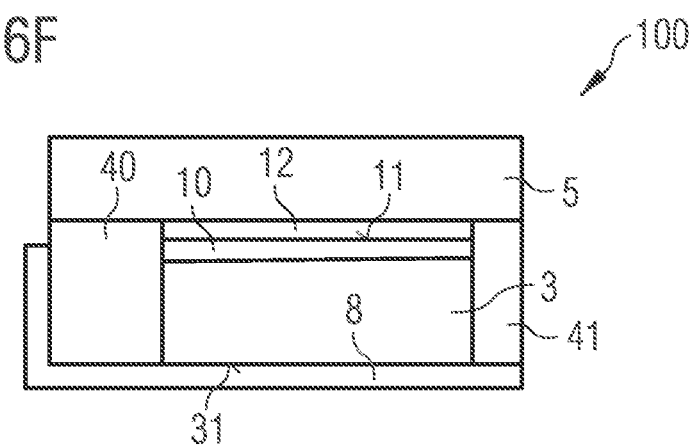

FIG. 6F shows an exemplary embodiment of a finished semiconductor chip 100 with the carrier 2 removed.

FIG. 7A shows the semiconductor chip 100 of FIG. 6F in 3D view, wherein it is apparent that, except for the side of the semiconductor chip 100 remote from the bottom 31, all the sides of the semiconductor chip 100 are completely coated with the mirror layer 8. The semiconductor chip 100 thus preferably emits radiation only via one side.

FIGS. 7B and 7C show the same semiconductor chip 100 as in FIG. 7A, but in plan view onto the semiconductor layer sequence 1 or in side view onto a side face 32 which is not covered with the contact elements 40, 41.

The exemplary embodiment of FIG. 7D shows, like FIG. 7C, a semiconductor chip 100 in side view. In contrast with FIG. 7C, however, the bottom 31 is not covered by a mirror layer 8, such that radiation can be emitted from the semiconductor chip 100 via the bottom 31. A mirror layer 8 patterned in strips is applied to one side face 32, wherein patterning of the mirror layer 8 adjusts the emission pattern through this side face 32.

Moreover, in FIG. 7D, the radiation emitted via the side of the semiconductor chip 100 remote from the bottom 31 is injected into a light guide. The radiation emitted from the side face 32 with the patterned mirror layer 8 is directed onto a display. A connection carrier 200 is located on the opposite side of the semiconductor chip 100 to the display. The side face 32 provided with the contact elements 40, 41 faces the connection carrier, wherein the contact elements 40, 41 are electrically contacted via the connection carrier 200.

FIG. 8A shows an exemplary embodiment of a light-emitting diode 500 in three different 3D views. The light-emitting diode 500 comprises a semiconductor chip 100, for example, according to one of the preceding exemplary embodiments. In particular, the carrier 3 of the semiconductor chip 100 has the shape of a cuboid with two opposing end faces. The end faces are side faces 32 of the carrier 3. The remaining two side faces 32 of the carrier 3 are longitudinal sides. The shape of the rectangular prism is elongate with the two end faces at the ends. In particular, the end faces are the faces of the cuboid which have the smallest area. In the present case, all the other faces of the cuboid have an area at least twice that of the end faces.

Contact blocks 401, 411 are applied to the two end faces. The contact blocks 401, 411, for example, consist of metal and completely cover the end faces. In particular, the contact blocks 401, 411 are larger than the end faces, such that the contact blocks 401, 411 project beyond the end faces in all directions parallel to the end faces. The contact blocks 401, 411 are moreover electrically conductively connected with the contact elements 40, 41.

The remaining sides of the semiconductor chip 100, namely the longitudinal sides, the bottom 31 of the carrier 3 and the semiconductor layer sequence 1, are completely surrounded by sheathing 501. The semiconductor chip 100 is consequently overall completely surrounded by the sheathing 501 and the contact blocks 401, 411. The sheathing 501 and the contact blocks 401, 411 thus encapsulate the semiconductor chip 100. The sheathing 501 is, for example, designed to convert some or all the radiation emitted by the semiconductor chip 100.

In the present case, the sheathing 501 on the sides of the semiconductor chip 100 is selected such that the thickness thereof corresponds to that of the regions of the contact blocks 401, 411 projecting beyond the end faces. Overall, in the direction away from the semiconductor chip 100, the sheathing 501 consequently terminates flush with the contact blocks 401, 411. An outer face of the light-emitting diode 500 formed by the sheathing 501 and the contact blocks 401, 411 is consequently smooth within the bounds of manufacturing tolerances. In the present case, the outer face of the light-emitting diode 500 corresponds to the outer face of a rectangular prism, in particular a cuboid. The end faces of the cuboid are formed in their entirety by the contact blocks 401, 411.

However, the shape of the contact blocks 401, 411 and the shape of the sheathing 501 may also be selected such that the outer face of the light-emitting diode 500, for example, corresponds to the outer face of a cylinder or an ellipsoid.

Figure 8B:
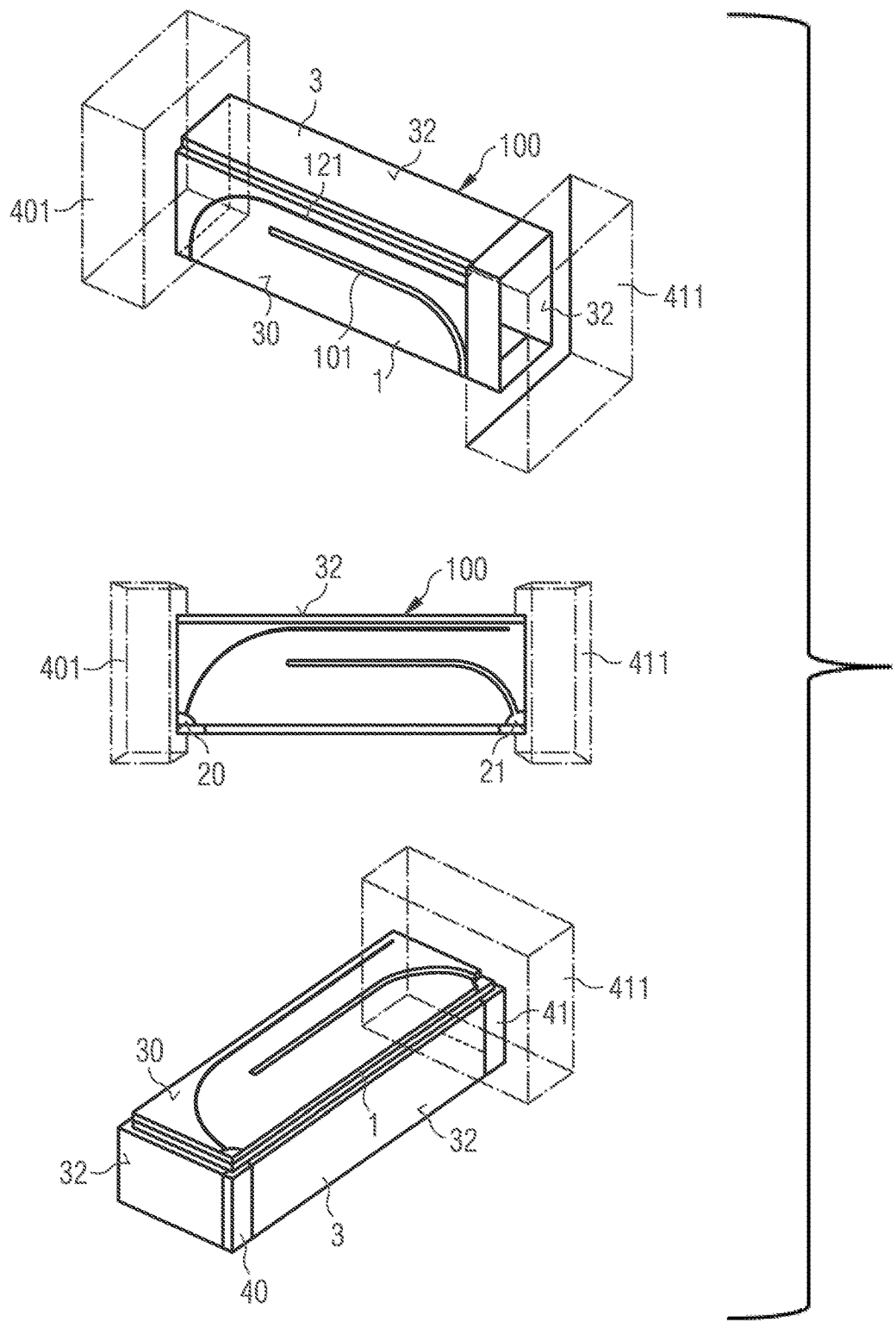

FIG. 8B shows substantially the same light-emitting diode 500 as in FIG. 8A, again in three different 3D views. However, to ensure greater clarity, the sheathing 501 is not shown this time. The first contact block 401 is also omitted from the illustration in one view.

In particular, it is apparent that the contact elements 40, 41 extend along a common longitudinal side of the carrier 3. The contact elements 40, 41 are, however, in electrical contact with the contact blocks 401, 411 at the edges adjoining the end faces.

It is furthermore readily apparent from FIG. 8B that the contact blocks 401, 411 extend in all directions beyond the end faces, for example, by at least 20 μm.

FIG. 9A likewise depicts a light-emitting diode 500 in 3D view. Various embodiments of this light-emitting diode 500 are shown in cross-sectional view in connection with FIGS. 9B to 9E. In each case, the figures depict the cross-section along the arrows shown in FIG. 9A.

In FIG. 9B, the sheathing 501 is completely formed from a converter material, for example, from the converter element 5 or potting material 50 as described above. Both the bottom 31 and the semiconductor layer sequence 1 are completely covered by the sheathing 501. The remaining side faces 32, not visible in FIG. 9B, of the carrier 3 may likewise be completely covered with the sheathing 501. The sheathing 501 of FIG. 9B is formed in one piece.

FIG. 9C shows a further exemplary embodiment in which the sheathing 501 on the bottom 31 is formed from a reflective material, for example, a material comprising $TiO_2$. The semiconductor layer sequence 1, on the other hand, is again covered by the light-converting sheathing 501. In the present case, the sheathing 501 thus comprises at least two regions and is not formed in one piece.

FIG. 9D shows an exemplary embodiment in which the second contact block 411 is formed in one piece and guided from the side face 32 to the bottom 31. The second contact block 411, for example, covers the bottom 31 to an extent of at least 50% or 70% or 90%. The semiconductor layer sequence 1 is again covered by the light-converting sheathing 501.

In FIG. 9E, both contact blocks 401, 411 extend from the side faces 32 to the bottom 31 and so likewise cover the bottom 31, for example, to an extent of at least 50% or 70% or 90%.

Figure 10A:
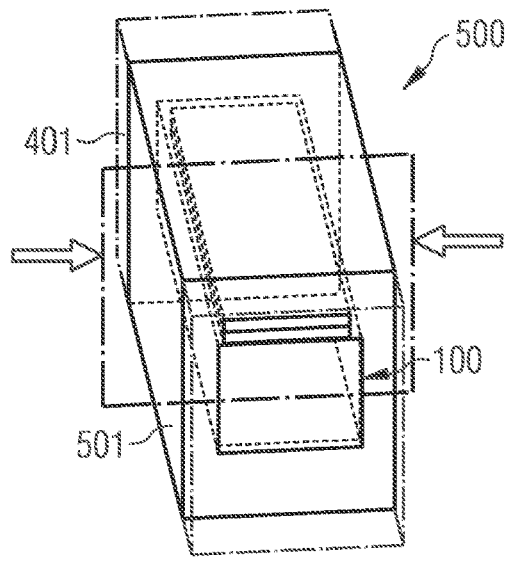

FIG. 10A again depicts a light-emitting diode 500 in 3D view. Various embodiments of this light-emitting diode 500 are shown in cross-sectional view in connection with FIGS. 10B to 10H. In each case, the figures depict the cross-section along the arrows shown in FIG. 10A.

Figure 10B:
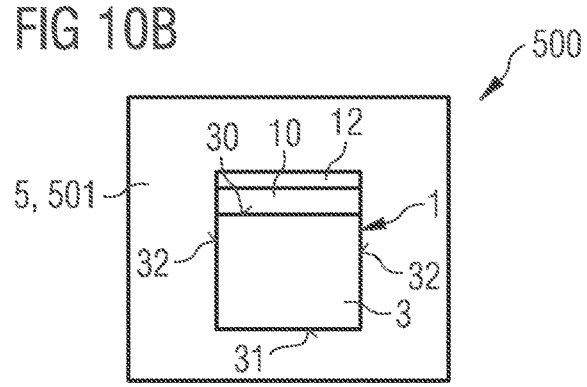

It is apparent from FIG. 10B that the sheathing 501 is formed in one piece. The sheathing 501 is completely formed from a converter material, for example, from a converter element 5 or potting material 50 as described above. The light-emitting diode 500 emits converted light in all directions of the plane of the paper.

Figure 10C:
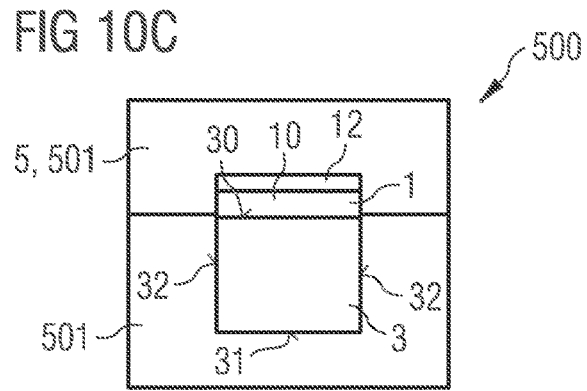

In FIG. 10C, the sheathing 501 is divided into two regions. The first region is light-converting and consists, for example, of the material of the converter element 5. The second region is light-reflecting. The second region covers the bottom 31 and the side faces 32 and terminates flush with the top 30 of the carrier 3. The second, light-converting region of the sheathing 501 is applied to the semiconductor layer sequence 1. The resultant light-emitting diode 500 emits converted light predominantly upwards.

FIG. 10D likewise shows a light-emitting diode 500 which predominantly emits upwards. The second, opaque region of the sheathing 501 projects, in the direction away from the bottom 31, beyond the top 30 and the semiconductor layer sequence 1. A cavity is consequently formed above the semiconductor layer sequence 1, which cavity is filled with the first, light-converting region of the sheathing 501.

FIG. 10E shows a light-emitting diode 500, in which the first, light-converting region of the sheathing 501 covers both the semiconductor layer sequence 1 and the side faces 32 of the carrier 3 and terminates flush with the bottom 31 of the carrier 3. The second, light-reflecting region of the sheathing 501 is applied to the bottom 31. The light-emitting diode 500 of FIG. 10E emits both upwards and to the side.

In the light-emitting diode 500 of FIG. 10F, the first, light-converting region of the sheathing 501 only covers the side faces 32 of the carrier 3. The first region terminates flush both with the bottom 31 and with the semiconductor layer sequence 1. The second, light-reflecting region of the sheathing 501 is applied to the semiconductor layer sequence 1 and the bottom 31. Such a light-emitting diode 500 predominantly emits to the side.

The light-emitting diode 500 of FIG. 10G is similar to the light-emitting diode 500 of FIG. 10F and likewise predominantly emits to the side. However, the first region of the sheathing 501 does not terminate flush with the semiconductor layer sequence 1 and the bottom 31, instead projecting beyond each. The resultant cavities beneath the bottom 31 and above the semiconductor layer sequence 1 are filled with the second, light-reflecting region of the sheathing 501.

The light-emitting diode 500 of FIG. 10H comprises a first, light-converting region of the sheathing 501, which completely covers the semiconductor layer sequence 1 and the side faces 32 of the carrier 3. The first region still projects for this purpose beyond the bottom 31. The resultant cavity beneath the bottom 31 is filled with the second, light-reflecting region of the sheathing 501.

In the light-emitting diode of FIG. 10I, the first, light-converting region of the sheathing 501 is applied to the semiconductor layer sequence 1 and only one side face 32. The bottom 31 and the other side face 32 are covered by the second, light-reflecting region of the sheathing 501.

FIG. 11A shows a further exemplary embodiment of a light-emitting diode 500 in side view. The sheathing 501 has an elliptical cross-section. The outer face of the sheathing 501 is thus ellipsoidal. The sheathing 501 consists, for example, of clear silicone with an external converter material layer.

The contact blocks 401, 411 project out beyond the sheathing 501. Unlike in the preceding exemplary embodiments, the contact blocks 401, 411 thus do not terminate flush with the sheathing 501 at the outer face of the light-emitting diode 500.

FIG. 11B shows a light-emitting diode 500 in plan view onto the first contact block 401. Unlike in FIG. 11A and the preceding exemplary embodiments, the contact blocks 401, 411 are smaller than the side faces 32 of the carrier 3 to which the contact blocks 401, 411 are applied. The corresponding side faces 32 are thus not completely covered by the contact blocks 401, 411. The contact blocks 401, 411 moreover have a circular base area. The outer face of the light-emitting diode 500 of FIG. 11B may be the outer face of a cylinder or an ellipsoid or an egg.

FIG. 12 shows an exemplary embodiment of an optoelectronic semiconductor device 1000 in which a plurality of the above-described light-emitting diodes 500 are stacked on one another. The contact blocks 401, 411 of adjacent light-emitting diodes 500 are here electrically connected together such that a parallel connection of a plurality of light-emitting diodes 500 is obtained. In operation, the various light-emitting diodes 500 may, for example, emit light of different colors.

Unlike the depiction in FIG. 12, however, a series connection of a plurality of light-emitting diodes 500 is also conceivable.

FIGS. 13A to 13E show various positions in a production method for one or more light-emitting diodes 500.

Figure 13A:
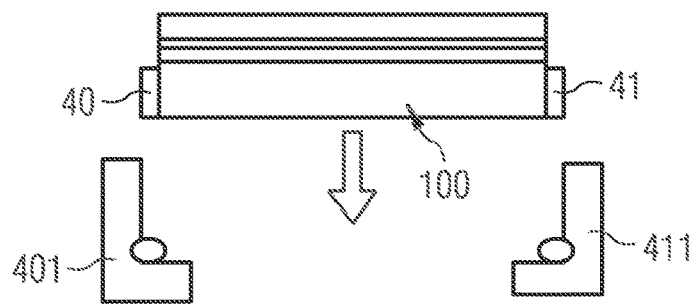
FIGS. 13A to 13F, 14A to 14C and 15A to 15D show various positions in exemplary embodiments of a production method for light-emitting diodes.

Two contact blocks 401, 411 are provided in FIG. 13A. Each of the contact blocks 401, 411 comprises a step with a bearing region onto which the semiconductor chip 100 is placed. The semiconductor chip 100 is mechanically carried by these bearing regions for the production of the light-emitting diodes 500. Droplets of adhesive or solder are furthermore applied to the bearing regions of the contact blocks 401, 411. When mounting the semiconductor chip 100, these droplets of adhesive or solder serve to provide a mechanically durable connection of the contact blocks 401, 411 with the semiconductor chip 100. The droplets of adhesive or solder may moreover bring about an electrical connection between the contact elements 40, 41 and the contact blocks 401, 411.

Figure 13B:
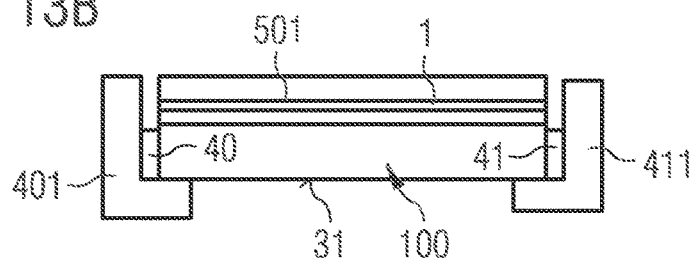

FIG. 13B shows a position in the method in which the semiconductor chip 100 is firmly and durably connected with the contact blocks 401, 411. A sheathing 501 in the form of a converter element is already applied to the semiconductor layer sequence 1 of the semiconductor chip 100. Due to the bearing regions, the bottom 31 of the semiconductor chip 100 is freely exposed to the air and, in the present case, has not yet been covered by the sheathing 501.

Figure 13C:
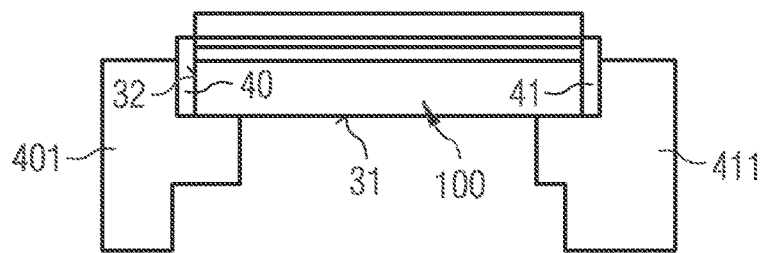

FIG. 13C shows a position in the production method in which the bearing regions of the contact blocks 401, 411 are differently constructed. Unlike in FIGS. 13A and 13B, the bearing regions do not terminate flush at the bottom, but instead take the form of overhanging projections on the contact blocks 401, 411. Once the semiconductor chip 100 has been mounted, the contact blocks 401, 411 do not completely cover the side faces 32 of the semiconductor chip 100.

Figure 13D:
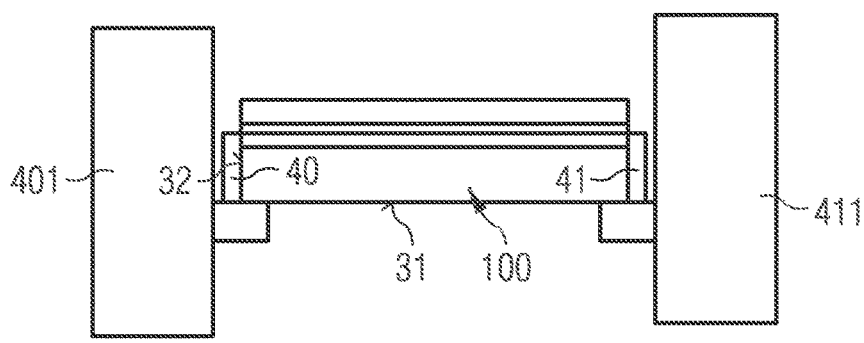

FIG. 13D discloses a further refinement of the contact blocks 401, 411. In this case too, the bearing regions take the form of projections on the contact blocks 401, 411. The contact blocks 401, 411 themselves, however, are larger than in FIG. 13C, such that, once the semiconductor chip 100 has been mounted, the side faces 32 of the semiconductor chip 100 are completely covered by the contact blocks 401, 411.

Figure 13E:
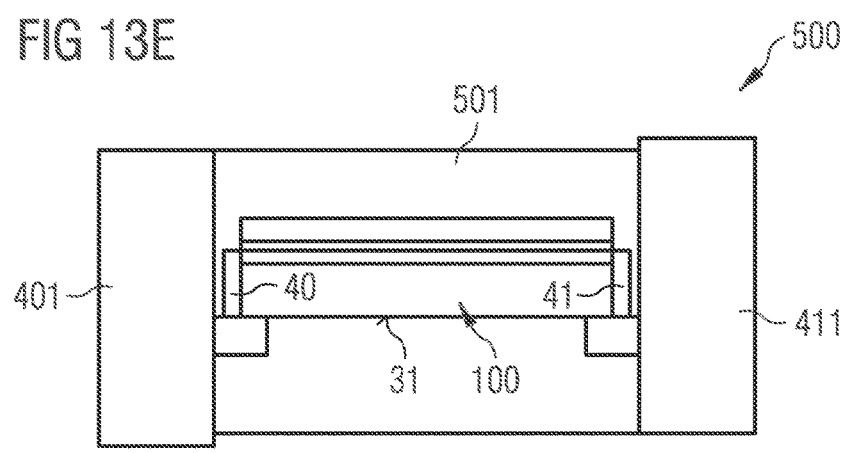

FIG. 13E shows a position in the production method which follows the position of FIG. 13D. All the sides of the semiconductor chip 100 which are not covered by the contact blocks 401, 411 are completely potted or surrounded by the sheathing 501. The sheathing 501 is in the present case formed in one piece and, in correct operation of the light-emitting diode 500, serves, for example, for light conversion.

Figure 13F:
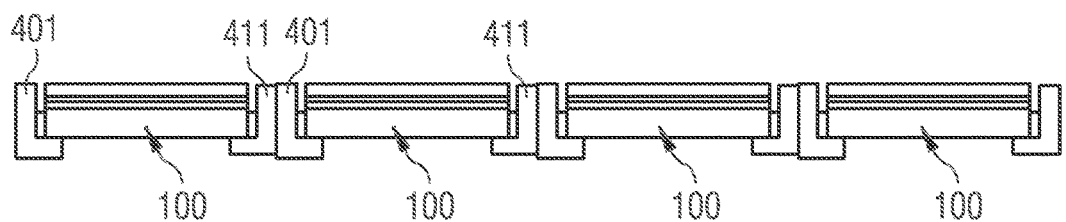

FIG. 13F depicts how a plurality of semiconductor chips 100 in the wafer assembly are mounted on the contact blocks 401, 411.

Figure 14A:
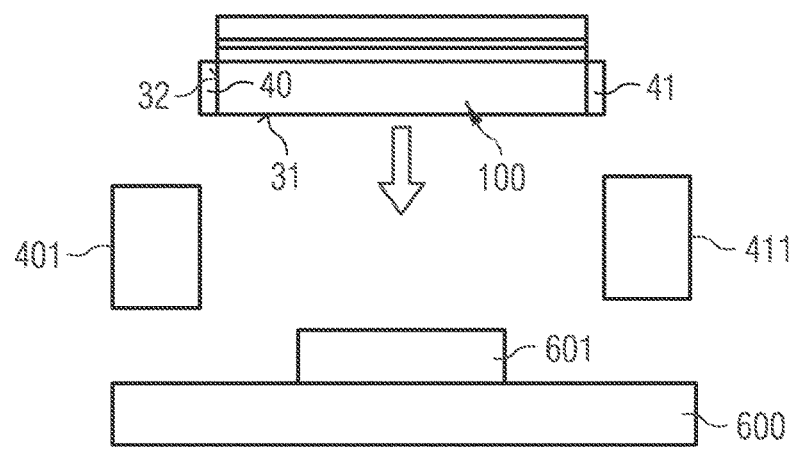
Figure 14B:
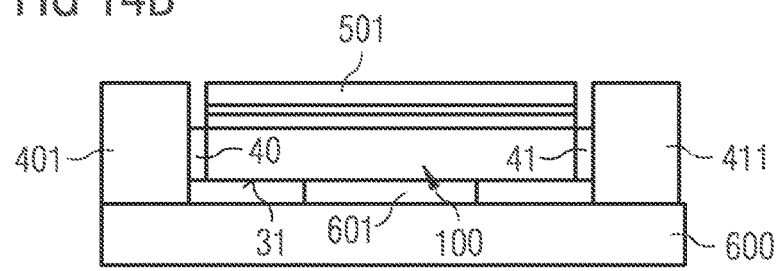
Figure 14C:
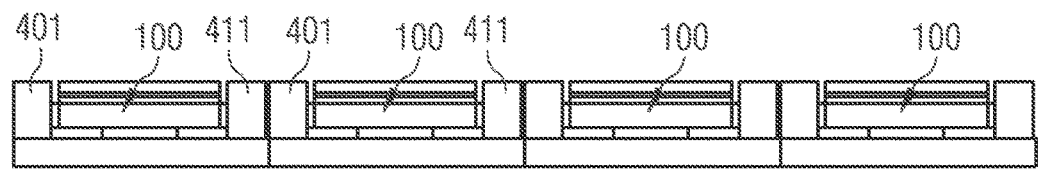

FIGS. 14A to 14C show positions in a further exemplary embodiment of the production method for light-emitting diodes 500. Unlike in the previously described method, use is here made of an auxiliary carrier 600. The contact blocks 401, 411 are placed onto the auxiliary carrier 600. A platform 601 is arranged on the auxiliary carrier 600 between the contact blocks 401, 411. The semiconductor chip 100 is placed with its bottom 31 on the platform 601. As a consequence, the bottom 31 of the semiconductor chip 100 is arranged on the auxiliary carrier 600 in a raised position relative to the bearing face of the contact blocks 401, 411. It is ensured in this manner that the contact blocks 401, 411 project beyond the side faces 32 covered by the contact blocks 401, 411. This effect was in each case achieved in the exemplary embodiments of FIGS. 13A to 13F by the bearing regions of the contact blocks 401, 411.

FIG. 14B moreover shows that the sheathing 501 is already applied to the semiconductor layer sequence 1. This may be achieved, for example, by potting.

FIG. 14C depicts how a plurality of light-emitting diodes 500 in the wafer assembly can be produced.

FIGS. 15A to 15D show positions in a further exemplary embodiment of the production method for the light-emitting diodes 500.

Figure 15A:
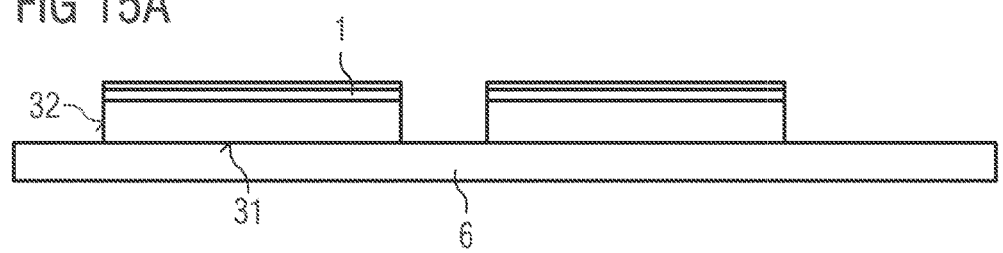

FIG. 15A shows a plurality of carriers 3, each with a semiconductor layer sequence 1 applied thereto, placed on an auxiliary carrier 6. Contact elements 40, 41 are then formed, for example, as described in connection with FIGS. 1A to 1D. The semiconductor chips 100 are consequently firstly obtained.

Figure 15B:
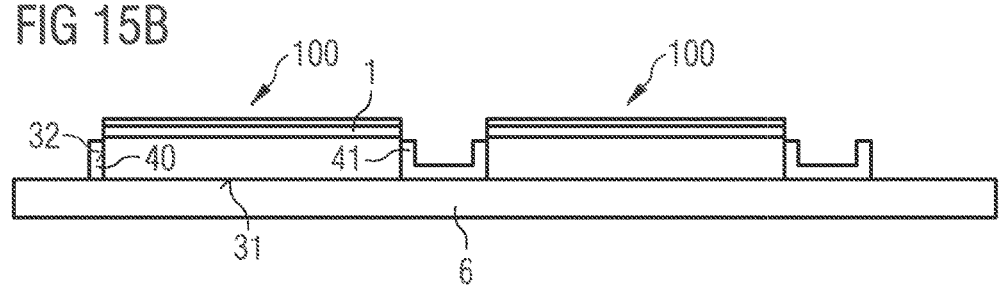

As is apparent from FIG. 15B, the contact elements 40, 41 of two adjacent semiconductor chips 100 are of cohesive construction. In the regions between the semiconductor chips 100, the auxiliary carrier 6 is thus likewise covered with the electrically conductive contact elements 40, 41. These regions of the auxiliary carrier 6 covered with the contact elements 40, 41 serve as a nucleation region or nucleation zones for formation of the contact blocks 401, 411.

Figure 15C:
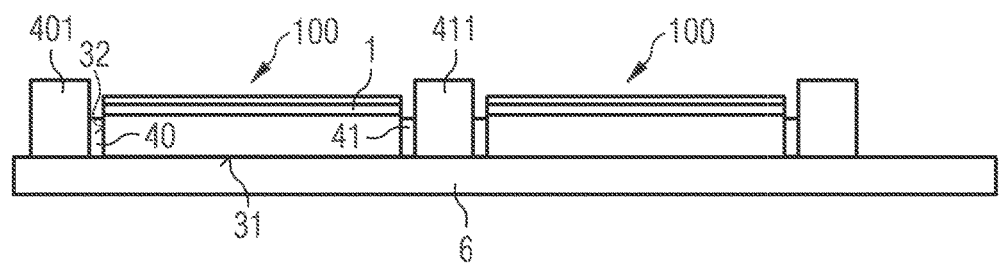

As shown in FIG. 15C, the contact blocks 401, 411 have grown in the nucleation regions by means of an electroplating method. The contact blocks 401, 411 project beyond the semiconductor chip 100 in a direction away from the auxiliary carrier 6.

Figure 15D:
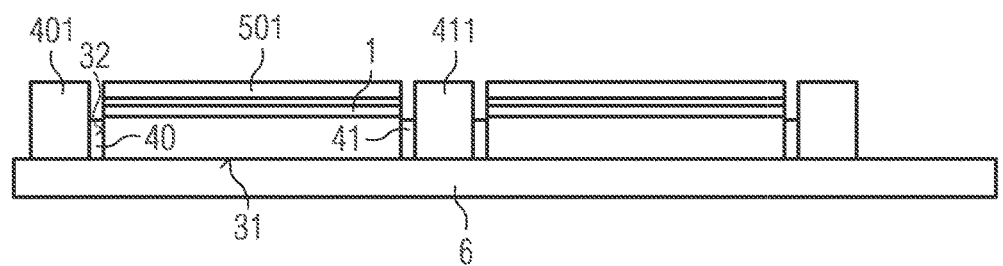

Then, as shown in FIG. 15D, the semiconductor chips 100 are additionally surrounded, for example, potted, by the sheathing 501.

The description made with reference to exemplary embodiments does not restrict the invention to these embodiments. Rather, the invention encompasses any novel feature and any combination of features, including in particular any combination of features in the claims, even if these features or these combinations are not themselves explicitly indicated in the claims or exemplary embodiments.

The invention claimed is:

1. An optoelectronic semiconductor chip comprising:
a main body comprising:
    a carrier comprising a top, a bottom opposite the top and side faces connecting the bottom with the top;
    a semiconductor layer sequence arranged on the top of the carrier, wherein the semiconductor layer sequence is configured to emit or absorb electromagnetic radiation; and
    two contact faces arranged on the semiconductor layer sequence remote from the carrier, wherein the semiconductor layer sequence is electrically contactable through the two contact faces; and
two contact elements contacting the contact faces and electrically conductively connected therewith,
wherein the contact elements comprise conductor tracks which are guided from the contact faces over edges of the main body on the side faces of the carrier,
wherein the contact elements extend to the bottom of the carrier,
wherein, in a region of the bottom, each contact element comprises a connection region for mounting and electrically contacting the semiconductor chip on a connection carrier,
wherein, in each connection region, the corresponding contact element is guided away from the carrier as a bridge, and
wherein, in a direction away from the bottom, the connection regions terminate flush with the bottom of the carrier.

2. The optoelectronic semiconductor chip according to claim 1,
wherein the contact elements comprise one-piece conductor tracks,
wherein the contact elements lie form-fittingly on the main body starting from the contact faces and continuing to the side faces,
wherein the carrier is a growth substrate for the semiconductor layer sequence, and
wherein the contact elements are arranged directly on the side faces of the carrier.

3. The optoelectronic semiconductor chip according to claim 1,
wherein the contact elements are guided on two mutually opposing side faces of the carrier, and
wherein all the remaining side faces of the carrier are free of the conductor tracks or radiation-opaque coatings.

4. The optoelectronic semiconductor chip according to claim 1,
wherein the contact elements are guided on the same side face of the carrier,
wherein all the side faces and the bottom are completely covered with a mirror layer, and
wherein the mirror layer reflects at least 90% of the radiation emitted by the semiconductor layer sequence.

5. The optoelectronic semiconductor chip according to claim 1,
wherein at least one of the sides of the main body or of the carrier is covered with a mirror layer,
wherein the mirror layer is a patterned mirror layer, and
wherein a converter element is applied to the patterned mirror layer.

6. The optoelectronic semiconductor chip according to claim 1,
wherein the semiconductor chip is a sapphire volume emitter in which the carrier is a sapphire carrier and the semiconductor layer sequence is grown on the sapphire carrier,
wherein the semiconductor layer sequence comprises a first layer of a first conductivity type facing the carrier, a second layer of a second conductivity type remote from the carrier and an active layer arranged between the first layer and the second layer,
wherein a first contact face is arranged on the first layer in a recess in the semiconductor layer sequence, wherein the second layer and the active layer are removed within the recess and the first layer is revealed,
wherein the first layer is electrically contactable by the first contact face,
wherein a second contact face is arranged on the second layer,
wherein the second layer is electrically contactable by the second contact face, and wherein the contact elements lie directly on the corresponding side faces of the carrier so that no further layers are arranged between the carrier and contact elements.

7. The optoelectronic semiconductor chip according to claim 1,
wherein the semiconductor chip has the geometric basic shape of a rectangular prism with six bounding faces,
wherein radiation is emitted via all the bounding faces of the semiconductor chip, and
wherein a proportion of the total surface area of the semiconductor chip, via which radiation emitted, is at least 99%.

8. The optoelectronic semiconductor chip according to claim 1, further comprising a converter element, wherein the converter element is located on the semiconductor layer sequence, wherein the converter element converts at least a proportion of the radiation emitted by the semiconductor layer sequence into radiation of another wavelength range, and wherein the converter element has a thickness of at most 50 μm.

9. The optoelectronic semiconductor chip according to claim 1, wherein, except for the bottom and the connection regions, the main body and the contact elements are completely encapsulated by a potting material, and wherein the potting material converts a proportion of the radiation emitted by the semiconductor layer sequence into radiation of another wavelength range.

10. A light-emitting diode comprising:
a semiconductor chip according to claim 1; and
two electrically conductive contact blocks located at two side faces of the carrier,
wherein the contact blocks are electrically conductively connected with the contact elements,
wherein a sheathing is arranged around the main body, wherein the sheathing entirely or partially covers parts of the main body that are not covered by the contact blocks, and
wherein, in an unmounted state of the light-emitting diode, the contact blocks on an outer face of the light-emitting diode are uncovered and are configured for external electrical contacting of the light-emitting diode.

11. The light-emitting diode according to claim 10, wherein the contact blocks completely cover the two side faces and, in plan view on the two side faces, project beyond the two side faces.

12. The light-emitting diode according to claim 10,
wherein the contact blocks are located at two mutually opposing side faces of the carrier,
wherein the semiconductor chip is completely surrounded by the sheathing and the contact blocks,
wherein the sheathing terminates flush with the contact blocks on the outer face of the light-emitting diode,
wherein the outer face of the light-emitting diode formed by the contact blocks and the sheathing is smooth within bounds of manufacturing tolerances, and
wherein the outer face of the light-emitting diode has the geometric shape of the outer face of a cylinder or rectangular prism or ellipsoid.

13. An optoelectronic semiconductor device comprising:
at least two light-emitting diodes according to claim 10, wherein the contact blocks of adjacent light-emitting diodes are in direct contact with one another.

14. An optoelectronic semiconductor device comprising:
at least two semiconductor chips according to claim 10,
wherein a contact element of a semiconductor chip is electrically conductively connected with a contact element of a further semiconductor chip, and
wherein the semiconductor chips are electrically connected in series or in parallel.

15. The optoelectronic semiconductor device according to claim 14,
wherein the contact element of the semiconductor chip is in direct mechanical and electrical contact with the contact element of the further semiconductor chip.

16. An optoelectronic semiconductor chip comprising:
a main body comprising:
a carrier comprising a top, a bottom opposite the top and side faces connecting the top with the bottom;
a semiconductor layer sequence arranged on the top of the carrier, wherein the semiconductor layer sequence is configured to emit or absorb electromagnetic radiation; and
two contact faces arranged on the semiconductor layer sequence remote from the carrier, wherein the semiconductor layer sequence is electrically contactable via the contact faces,
two contact elements located at the contact faces and electrically conductively connected therewith,
wherein the contact elements comprises conductor tracks which are guided from the contact faces over edges of the main body to the side faces of the carrier,
wherein the carrier is a growth substrate for the semiconductor layer sequence, and
wherein the contact elements are directly located on the corresponding side faces of the carrier.

17. A light-emitting diode comprising:
a semiconductor chip comprising:
a main body comprising:
a carrier comprising a top, a bottom opposite the top and side faces connecting the bottom with the top;
a semiconductor layer sequence arranged on the top of the carrier, wherein the semiconductor layer sequence is configured to emit or absorb electromagnetic radiation; and
two contact faces arranged on the semiconductor layer sequence remote from the carrier, wherein the semiconductor layer sequence is electrically contactable through the two contact faces; and
two contact elements contacting the contact faces and electrically conductively connected therewith, wherein the contact elements comprise conductor tracks which are guided from the contact faces over edges of the main body on the side faces of the carrier; and
two electrically conductive contact blocks located at two side faces of the carrier,
wherein the contact blocks are electrically conductively connected with the contact elements,
wherein a sheathing is arranged around the main body,
wherein the sheathing entirely or partially covers parts of the main body that are not covered by the contact blocks, and
wherein, in an unmounted state of the light-emitting diode, the contact blocks on an outer face of the light-emitting diode are uncovered and are configured for external electrical contacting of the light-emitting diode.

18. The light-emitting diode according to claim 17, wherein the contact blocks completely cover the two side faces and, in plan view on the two side faces, project beyond the two side faces.

19. The light-emitting diode according to claim 17,
wherein the contact blocks are located at two mutually opposing side faces of the carrier,
wherein the semiconductor chip is completely surrounded by the sheathing and the contact blocks,
wherein the sheathing terminates flush with the contact blocks on the outer face of the light-emitting diode,
wherein the outer face of the light-emitting diode formed by the contact blocks and the sheathing is smooth within bounds of manufacturing tolerances, and
wherein the outer face of the light-emitting diode has the geometric shape of the outer face of a cylinder or rectangular prism or ellipsoid.

20. An optoelectronic semiconductor device comprising:
at least two light-emitting diodes according to claim 17,
wherein the contact blocks of adjacent light-emitting diodes are in direct contact with one another.

* * * * *